US005959871A

United States Patent [19]

Pierzchala et al.

[11] Patent Number: 5,959,871

[45] Date of Patent: Sep. 28, 1999

[54] PROGRAMMABLE ANALOG ARRAY CIRCUIT

[75] Inventors: Edmund Pierzchala, Milwaukie; Marek A. Perkowski, Beaverton, both of Oreg.

[73] Assignee: Analogix/Portland State University, Portland, Oreg.

[21] Appl. No.: 08/362,838

[22] Filed: Dec. 22, 1994

Related U.S. Application Data

[63] Continuation-in-part of application No. 08/173,414, Dec. 23, 1993, abandoned.

[51] Int. Cl.[6] .................. H03K 17/693

[52] U.S. Cl. .................. 364/489; 327/565; 326/39

[58] Field of Search .................. 364/488, 489, 364/490; 326/39, 41; 327/341, 526, 566, 565

[56] References Cited

U.S. PATENT DOCUMENTS

| | | | |
|---|---|---|---|
| 4,870,302 | 9/1989 | Freeman | 326/41 |
| 4,873,459 | 10/1989 | El Gamal | 326/41 |
| 4,918,440 | 4/1990 | Furtek | 340/825.83 |
| 5,047,655 | 9/1991 | Chambost et al. | 395/24 |
| 5,107,146 | 4/1992 | El-Ayat | 326/41 |
| 5,189,321 | 2/1993 | Seevinck | 327/341 |
| 5,196,740 | 3/1993 | Austin | 327/566 |
| 5,245,565 | 9/1993 | Petersen et al. | 364/825 |
| 5,325,317 | 6/1994 | Petersen et al. | 364/724.01 |
| 5,336,937 | 8/1994 | Sridhar et al. | 395/24 |
| 5,361,040 | 11/1994 | Barrett | 330/253 |

OTHER PUBLICATIONS

Rodriguez–Vazquez et al., *IEEE Trans. Cir. Sys. II*, 40:132–146, 1993.

Roska and Chua, IEEE Trans. Cir. Sys. II, 40:163–173, 1993.

Sivilotti, *Advanced Res. VLSI, Proc. Fifth MIT Conf.*, ed. Leighton, pp. 237–258, MIT Press, Cambridge, MA, 1988.

Van der Spiegel et al., *J. Solid–State Circ.* 27:82–92, 1992.

Vallancourt and Tsividis, *IEEE ISSCC Dig. Tech. Papers*, pp. 208–209, 1987.

Varrientos et al., *IEEE Trans. on Cir. Sys. II* 40:147–155, 1993.

Baktir and Tan, *IEEE Trans. Cir. Sys.* 40:200–206, 1993.

Dalla Betta et al., *IEEE Trans. Cir. Sys.* 40:206–215, 1993.

van den Broeke and Nieuwkerk, *IEEE J. Solid–State Cir.* 28:862–864, 1993.

Chua and Roska, *IEEE Trans. Cir. Sys. I* 40:147–156, 1993.

Ismail et al., *IEEE J. Solid–State Cir.* 23:183–194, 1988.

Krieg et al., *ISCAS*, pp. 958–961, IEEE, 1990.

Lee and Gulak, 1991 *IEEE ISSCC Dig. Tech. Papers*, 34:186–187, 1991. [Lee and Gulak I].

Lee and Gulak, *IEEE J. Solid–State Circ.*, 26:1860–1867, 1991. [Lee and Gulak II].

Lee and Gulak, Electronics Lett. 28:28–29, 1992. [Lee and Gulak III].

Lee and Gulak, *Proc. EPGA '94 Workshop*, ACM, Berkely, CA, 1994. [Lee and Gulak IV].

Loh and Geiger, ISCAS, pp. 2248–2251, Singapore, 1991.

Loh et al., *IEEE Trans. Cir. Sys.* 39:265–276, 1992.

Manetti and Piccirilli, *Proc. 6th Mediterranean ELectrotechnical Conference*, pp. 355–358, Ljubljana, Yugoslavia, 1991.

Mashiko et al., *ISCAS*, pp. 1279–1282, 1991.

(List continued on next page.)

*Primary Examiner*—Vincent N. Trans
*Attorney, Agent, or Firm*—Jeffrey B. Oster

[57] ABSTRACT

There is disclosed a programmable analog or mixed analog/digital circuit. More particularly, this invention provides a circuit architecture that is flexible for a programmable electronic hardware device or for an analog circuit whose input and output signals are analog or multi-valued in nature, and primarily continuous in time. There is further disclosed a design for a current-mode integrator and sample-and-hold circuit, based upon Miller effect.

6 Claims, 16 Drawing Sheets

OTHER PUBLICATIONS

Chua and Yang, *IEEE Trans. Cir. Sys.* pp. 1257–1272, 1988. [Chua and Yang I].

Chua and Yang, *IEEE Trans. Cir. Sys.* pp. 1273–1290, 1988. [Chua and Yang II].

Cimagalli et al., *IEEE Trans. Cir. Sys. II*, 40:174–183, 1993.

Intel Corp., 80170NX, Electrically Trainable Analog Neural Network, Santa Clara, Calif., 1991.

Cruz and Chua, *IEEE Trans. Cir. Sys.* 38:812–817, 1991.

EL Gamal et al., *IEEE J. Solid–State Circ.* 24:394–398, 1989.

Gilbert, *IEEE ISSCC Dig. Tech. Papers*, pp. 286–287, 1984.

Gold Mavretic, *IEEE Midwest Symp. Cir. Sys.*, pp. 984–987, 1988.

Harrer et al., *IEEE Trans. Neural Networks* 3:466–476, 1992.

PMI, GAP–01, Analog Signal Processing Subsystem.

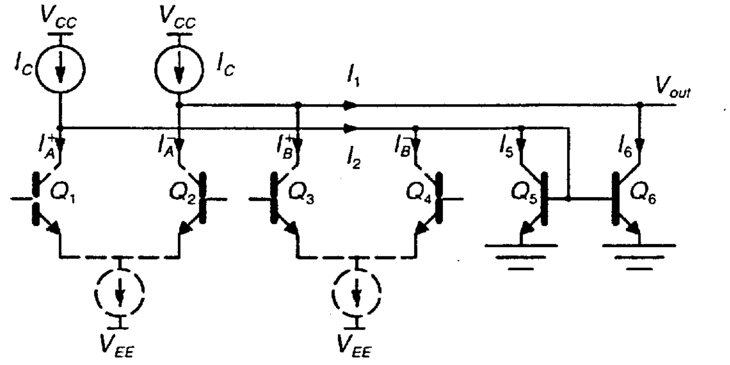
FIGURE 5B.
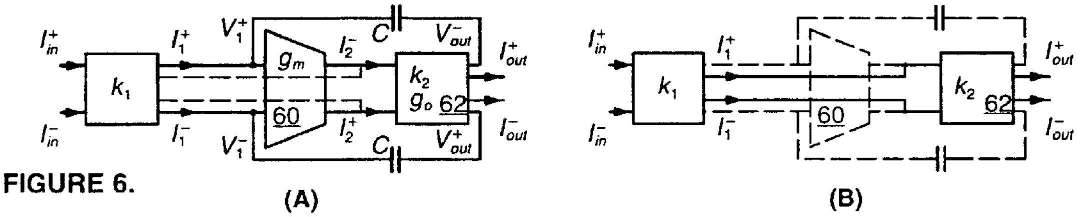
FIGURE 6. (A) (B)
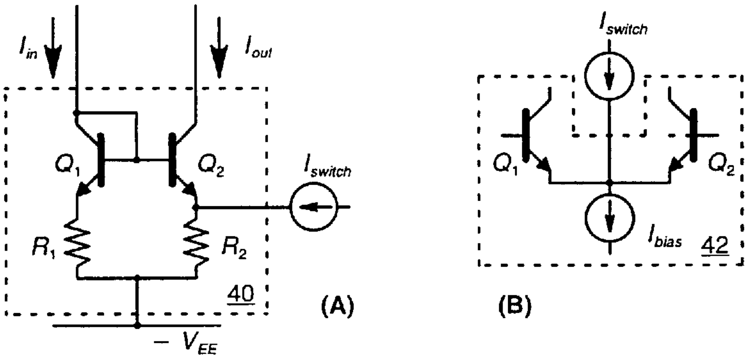
FIGURE 7. (A) (B)
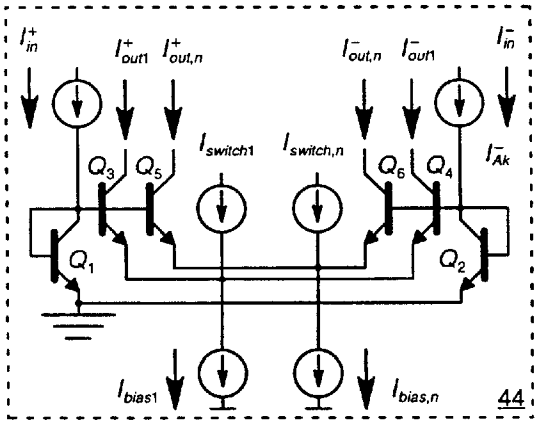
(C)
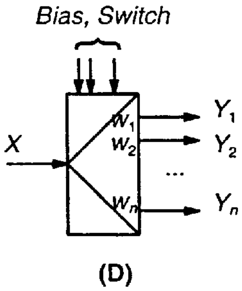
(D)
FIGURE 7 (continued).

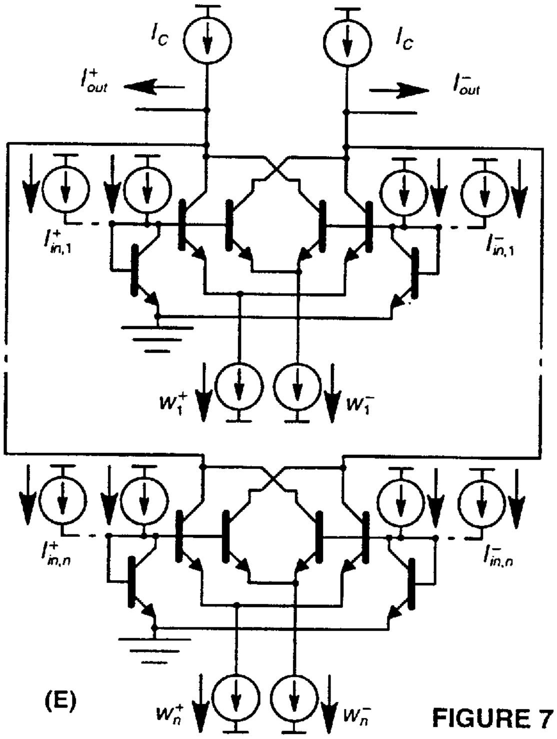
(E)
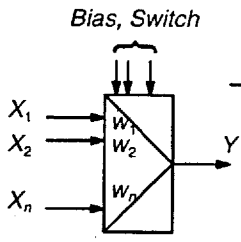
(F)
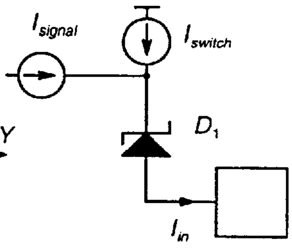
(G)
FIGURE 7 (continued).
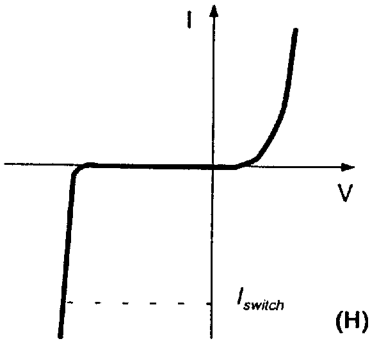
(H)
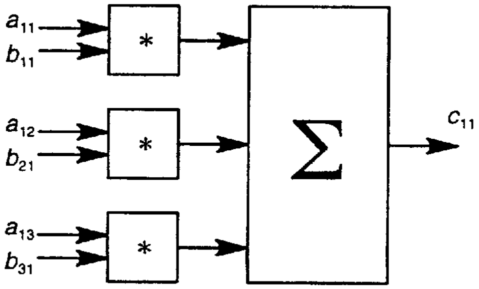
(A)
FIGURE 8.
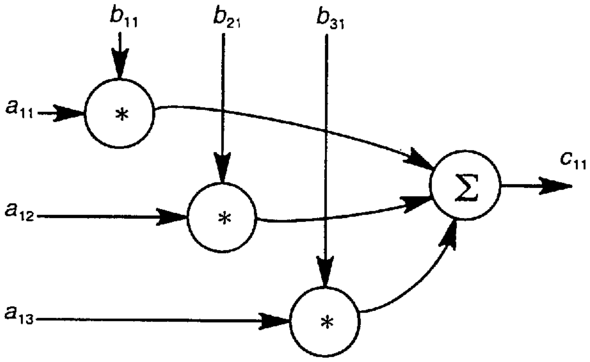
(B)

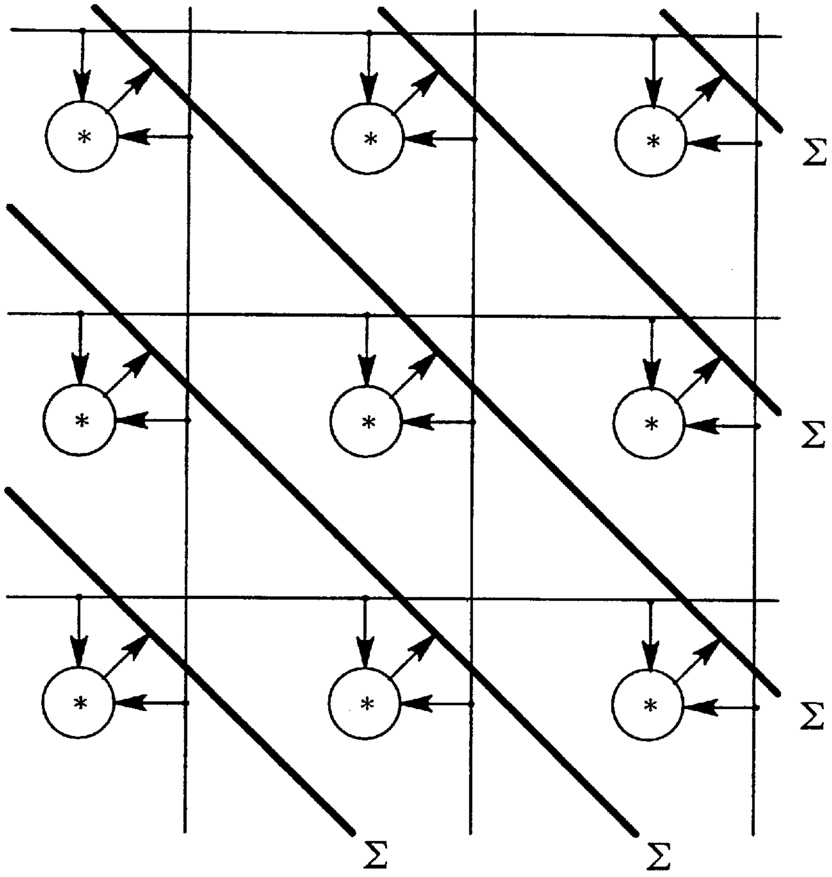
(C)
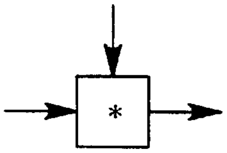
(D)
FIGURE 8 (continued).

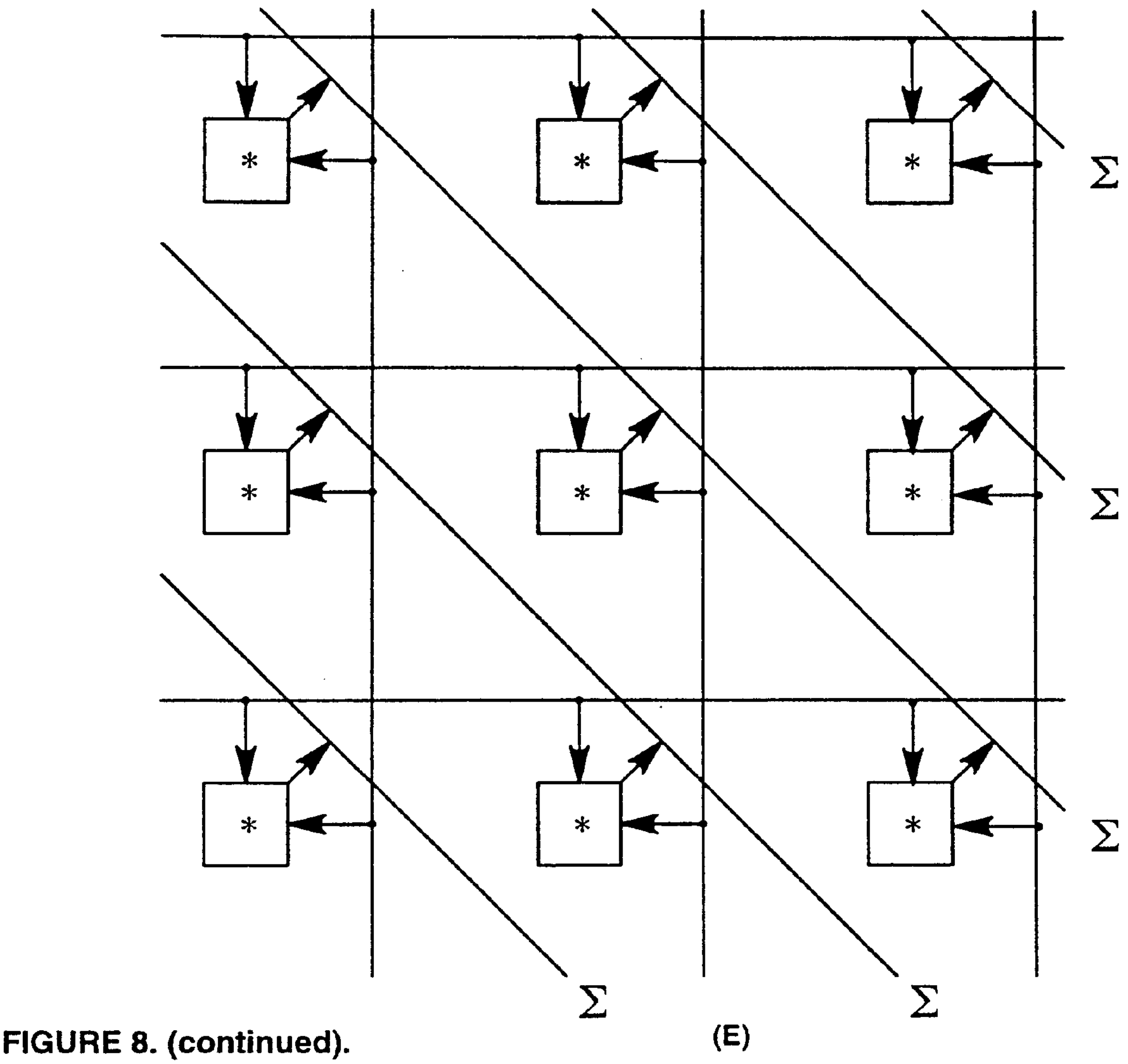
FIGURE 8. (continued). (E)

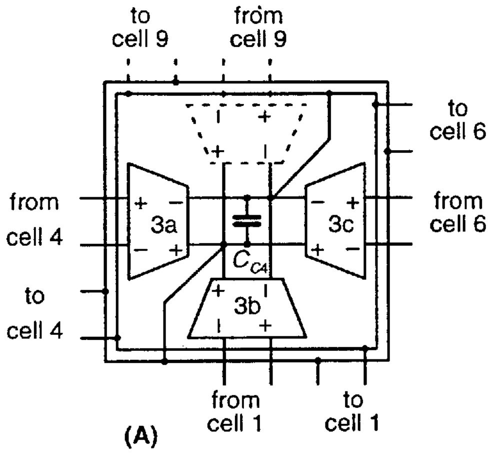
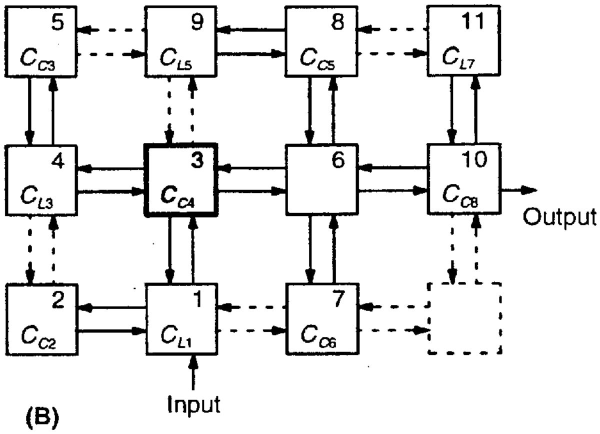
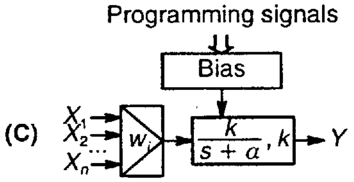
FIGURE 11.
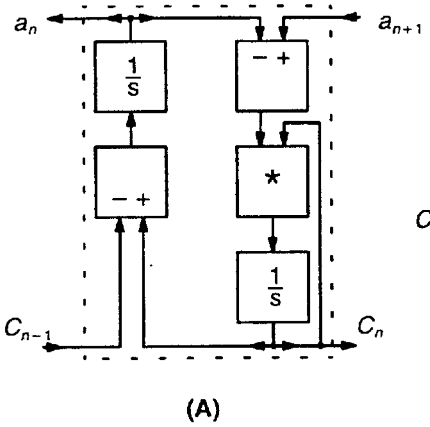
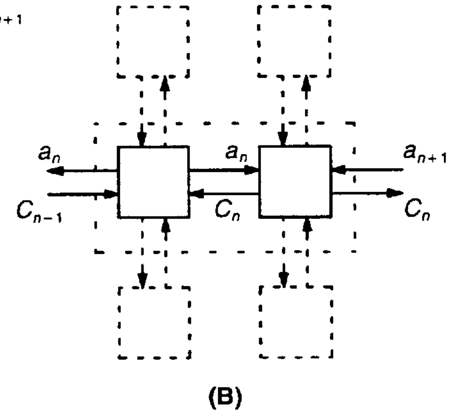
FIGURE 12.

| $a \oplus b$ | 0 | 1 | 2 | 3 |
|---|---|---|---|---|
| 0 | 0 | 1 | 2 | 3 |
| 1 | 1 | **0** | 3 | 2 |
| 2 | 2 | 3 | **0** | 1 |
| 3 | 3 | 2 | 1 | 0 |

(A)

| $a \otimes b$ | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

(B)

| $f(a+b)$ | 0 | 1 | 2 | 3 |
|---|---|---|---|---|
| 0 | 0 | 1 | 2 | 3 |
| 1 | 1 | **2** | 3 | 2 |
| 2 | 2 | 3 | **2** | 1 |
| 3 | 3 | 2 | 1 | 0 |

(C)

PROGRAMMABLE ANALOG ARRAY CIRCUIT

CROSS REFERENCE TO RELATED APPLICATION

This patent application is a continuation-in-part of U.S. patent application Ser. No. 08/173,414 filed Dec. 23, 1993 now abandoned.

TECHNICAL FIELD OF THE INVENTION

This invention provides a programmable analog or mixed analog/digital circuit. More particularly, this invention provides a circuit architecture that is flexible for a programmable electronic hardware device or for an analog circuit whose input and output signals are analog or multi-valued in nature, and primarily continuous in time. This invention further provides a design for a current-mode integrator and sample-and-hold circuit, based upon Miller effect.

BACKGROUND OF THE INVENTION

Analog circuits are a necessary component of many modern signal and information processing systems. The "real world" is primarily analog in nature and almost every digital system that interacts with the "real world" must have analog-to-digital and digital-to-analog interfaces. Analog circuits are continuous in time with a continuous signal, whereas circuits such as CNN's (cellular neural networks) operate in a discrete time (d-t) mode. In several applications (e.g., anti-aliasing and smoothing (reconstruction) filters, or pulse-slimming circuits in computer disk memories), analog circuits cannot be replaced by digital circuits either for reasons of speed or for analog's unique ability to work in a continuous-time (c-t) mode. Digital information can be processed in analog form to gain speed (e.g., image processing requiring many multiplications). Moreover, even if a digital solution exists, an analog solution may be smaller, require less power, generate less noise and be more reliable (e.g., a smaller number of elements to go wrong). Analog circuits have been avoided in the art since analog designs are often more difficult than digital and have often had to consider low-level circuit interactions, and since analog system have suffered dependencies, such as on temperature, fabrication run and time. Therefore, there is a need in the art for a novel analog architecture that is flexible and can even accommodate mixed signal (digital and analog) system designs.

In some signal processing applications, analog circuits are preferred over digital circuits for their relative simplicity. In the field of analog c-t circuit design and architecture, full programmability (i.e., one of parameters and structure) has not been achieved commercially. Previous analog programmable circuit designs have favored flexibility (universality) of the architecture (i.e., pattern of connections in a programmable device) rather than performance. There is a wide spectrum of architectures of analog circuits which do not comprise any particular "pattern" or architecture of interconnection schemes. Therefore, programmable devices for analog circuits in the art feature long global signal interconnection schemes. The common characteristic of long global interconnection schemes of current programmable analog circuits is that they achieve greater flexibility of interconnection patterns, sometimes allowing every cell in a programmable device to be connected with every other cell. Such an approach favors flexibility of a programmable device, but jeopardizes high frequency performance. This also causes parasitic problems associated with long signal lines and crosstalk between long analog lines and digital lines on the same chip increasing noise and stability problems in analog and mixed signal (analog and digital) designs. Such problems are most acute in a high-frequency (HF) domain where analog circuits have their most desired applications.

There are many published circuits for multiple-valued logic and continuous or fuzzy logic circuits, there are no programmable devices for multiple-valued, continuous or fuzzy logic circuits. Therefore, there is a need in the art for a field-programmable analog array (FPAA) that can be used for implementation of a wide class of multi-valued logic, fuzzy logic and other continuous logic circuits.

Programmable hardware devices for digital circuits include such devices as programmable logic arrays (PLAs), programmable logic devices (PLDs), and field-programmable gate arrays (FPGAs). "Programmability" in this context means the ability of a hardware device to change its configuration and function in response to some kind of programming information, in order to perform a required task. This programmability is distinct from "software" programmability (such as the programmability of a microprocessor), which directs a sequence of steps to be performed but does not necessarily produce changes in the hardware characteristics of the device. Programmable hardware devices for discrete-time signal processing are limited to relatively low frequencies when used to process analog signals. Such circuits also cannot substitute for continuous-time circuits in applications such as anti-aliasing. Programmable hardware devices for analog, continuous-time signal processing, however, are not commercially available.

Programmability opens up new ways of designing and building circuits for a given domain. For example, as soon as a technical means for realizing digital programmable circuits became available, new techniques of implementing digital circuits emerged. However, techniques for attaining programmability of digital circuits are inappropriate for analog circuits, for at least two reasons. First, to attain flexibility for creating various topologies of digital circuits realized by means of programmable devices, long global signal interconnections are often employed. These long interconnections introduce signal delays and phase errors that are tolerable, although undesired, in digital circuits. Such delays and errors would be fatal to analog circuits. Secondly, digital programmability techniques usually employ some kind of electronic switches. All realizations of such switches of practical interest for integrated circuits (ICs) suffer from considerable parasitics, namely substantial resistance in the "on" state, and parasitic capacitances. The net result of these parasitics is the introduction of phase errors in transmitted signals, an effect similar to that caused by long signal interconnections. Again, whereas these errors are tolerable in digital circuits, they are fatal for analog circuits. The foregoing problems are most severe for the fastest (i.e., HF analog circuits) which are the most desirable ones.

The development of various analog integrated circuits (ICs) has led analog IC design to the point where it is desirable and advantageous to have universal analog and mixed-signal programmable circuits. Multi-valued and fuzzy-logic circuits are often based on the same or similar circuit techniques as analog circuits and analog programmable circuits could be used for their implementation.

Circuits can generally operate in current-mode or in voltage mode. The majority of circuit designs operate in a voltage mode. Advantages of current-mode operations of circuits are speed and immunity or resistance to noise.

Low frequency (e.g., acoustic range) analog programmable circuits can be built easily in MOS subthreshold technology. In this technology processing elements (i.e., cells of the programmable device) can work in subthreshold mode, whereas the switches (for programming the programmable device) can be realized as MOS transistors working in inversion mode. This approach would be suitable for low-frequency applications only. Consequently, even though a field-programmable analog array is theoretically possible, the realization of such a programmable device would have a most limited scope of applications, limited to artificial neural networks (ANN's) and low-frequency signal processing. One advantage of analog c-t processing is speed. Slower applications can be adequately served by digital or switched-capacitor (SC) circuits, where programmability is easier to achieve. Fully programmable SC circuits are commercially available.

The nature of cellular neural networks (CNNs) is different than that of fully programmable circuits. CNNs are massively parallel collections of information processing units called cells, having memory (state information). CNNs are capable of attaining one of many equilibrium states due to a complex pattern of cell interactions through exclusively local interconnections. A CNN is either in one equilibrium state, when state and output information in cells is constant over time, and represents a solution of a certain problem, or is in the process of changing state and output information of its cells in order to attain one of its equilibria. Such a process of changing state and output information of its cells is actually the computation performed by a CNN. It is initiated by providing initial state information and input information.

CNNs are not programmable devices in any sense. CNNs are, instead, special processors dedicated to solving certain information processing problems. Although the computation of a CNN can be performed continuously in time and in signal domain, the state and output information of CNN cells is not meaningful until the CNN reaches an equilibrium. Thus, a CNN is, de facto, a d-t processor, since meaningful output information is available only at time intervals when it remains in an equilibrium. Moreover, since the set of equilibria in a CNN is discrete, the output information of a CNN is also in discrete form.

Field-programmable gate arrays for digital circuits are available from a few sources. However, field-programmable gate arrays for analog circuits are not available. Field-programmable gate arrays for analog circuits have to overcome several problems such as bandwidth, linearity, signal-to-noise ratio, frequency response and the like. One approach has been attempted by Lee and Gulak ("Field-Programmable Analogue Array Based on Mosfet Transconductors" *Electronics Lett.* 28:28–29, 1992). Lee and Gulak attempted to achieve full programmability by having connections between configurable analog blocks realized using MOSFET transconductors and controlling conductance by varying the gate voltage defined by a multivalued memory system.

In another attempt using a digital system, Furtek (U.S. Pat. No. 4,918,440) describes exclusively digital programmable logic cells and arrays of such cells having an integrated logic and communications structure which emphasizes local communication.

Therefore, there is a need in the art for a programmable analog device suitable for high frequency analog operation, a family of general-purpose mixed (analog and digital) signal-processing cells, and a method of creating architectures, i.e., patterns of interconnections of collections of such cells, suitable for a wide class of analog, multi-valued and fuzzy logic, circuit applications.

An integrator is a basic building block for many analog signal processing systems, such as filters (Schaumann et al., "Design of Analog Filters" Prentice Hall, Englewood Cliffs, N.Y., 1990). The main requirement for an integrator design are low excess phase, high linearity (frequency range and slew rate), high DC gain, and availability of electronic tuning. In one OTA-C (operational transconductance amplifier and capacitor) technique of filter implementation, integrators are realized by loading a transconductor (OTA) with a capacitor. The output signal is taken directly from the capacitor and the circuit has high output impedance, inherited from the OTA. To alleviate the loading effect of other OTAs typically connected to the integrator's output, techniques, such as parasitic absorption (Schaumann et al. infra.) have been developed. Another solution is a voltage-to-voltage, or current-to-voltage integrator, based on the Miller effect. A voltage-output Miller integrator was followed by an OTA ((Haigh, "Continuous-time and Switched Capacitor Monolithic Filters Based on LCR Filter Stimulation using Current and Charge Variables" in Analogue IC Design, the current-mode approach, ed. Toumazou et al., Peter Peregrinus Ltd. 1990) to realize a current-to-current integrator. In this arrangement, the linearity of the integrator depends on the linearity of the OTA. However, there is a need in the art for an integrator with current input and current output, and good linearity and high speed. This invention was also made to address this need.

The full speed potential of analog circuits can be utilized by c-t Field-Programmable Analog Arrays (FPAAs). However, there are two problems that first need to be overcome. The first is to provide an architecture (interconnection scheme) complex enough to be programmable, yet contributing little interference, crosstalk and noise problems that are major problems in analog designs. The present invention overcomes this first problem. The second problem is designing a flexible, universal unit of a FPAA without explicit use of electronic switches in the signal path to attain programmed functionality. Switch parasitics, such as finite on resistance and stray capacitances, lead to frequency performance degradation. The present invention overcomes this second problem as well.

SUMMARY OF THE INVENTION

This invention provides a programmable analog or mixed (i.e., analog/digital) circuit, called a FPAA. More particularly, this invention provides a circuit architecture that is flexible for a programmable electronic hardware device or for a predominantly analog circuit whose input and output signals are analog or multi-valued in nature, and primarily continuous in time.

The invention provides a circuit architecture scheme for designing an analog circuit or a mixed analog/digital circuit device comprising an array of analog signal processing cells wherein each cell comprises an analog signal processing portion and a control circuit, wherein the array of cells are connected by a plurality of local signal interconnects. Preferably, the signals carried by the local signal interconnects are in a current-mode.

The invention further provides a programmable analog device comprising an array of programmable analog signal processing cells, wherein each analog signal processing cell comprises an analog signal processing portion and a control circuit, wherein the control circuit controls the operation of the analog signal processing portion and may also take part in auxiliary information processing, wherein the cells in the array are interconnected by one or a plurality of local signal interconnections to form the programmable analog device. A signal interconnection is considered local in that the number of cells connected to the signal interconnection does not change as the number of cells in the programmable analog device varies. For example, if the number of programmable analog signal processing cells is doubled to provide for a larger programmable device, the number of cells connected to then-existing local signal interconnections does not change. Preferably, the programmable analog device further comprises one or a plurality of global signal interconnections for connecting various cells of the array together. A signal interconnection is considered global in that the number of programmable analog signal processing cells connected by a global signal interconnection changes as the number of cells in the array varies.

The invention further provides a method for making the inventive programmable device comprising, (a) deriving a circuit interconnection labeled multi-graph from a schematic diagram of a representative circuit within a class of circuits, (b) adding nodes and edges to the circuit interconnection labeled multi-graph according to a predetermined strategy to create a superset of the circuit interconnection labeled multi-graph, (c) grouping together one or more selected edges and nodes from the graph to form an interconnection labeled multi-graph to impart functionality to the cells within the programmable device, and (d) deriving a floor plan of the programmable device, whereby the total length of signal interconnections in the floor plan is minimized.

The invention further provides a method for mapping a particular circuit onto a programmable device to form a programmed device, comprising (a) providing a programmable device comprising an array of signal processing cells connected by local and global signal interconnections, wherein the array of signal processing cells is described by an interconnection labeled multi-graph defined by a particular number and arrangement of signal interconnections to each cell, (b) deriving a circuit labeled multi-graph of electrical connections from a schematic diagram of the particular circuit, and (c) embedding the circuit labeled multi-graph into the interconnection labeled multi-graph by selectively programming cells or signal interconnections in the device. Preferably, the embedding step may comprise selecting signal interconnections in the programmable device, according to a predetermined strategy to minimize overall length of interconnections within the programmed device (as defined by its floor plan), wherein the predetermined strategy comprises a one-to-one mapping of the circuit labeled multi-graph into the interconnection labeled multi-graph, whereby the total length of interconnections is minimized.

The invention further provides a method for programming an electronic subcircuit, comprising (a) providing a programmable electronic subcircuit comprising a signal path and one or more transistors controlling signal flow through the signal path, wherein each transistor comprises multiple operating points that determine the signal propagation characteristics of the transistor, (b) providing a source of control current or voltage to part of the transistor, with the source being removed from the signal path, and (c) changing the operating point of the transistor by changing the control current or voltage sufficiently to switch the transistor on and off and thereby turn on and off the signal flow through the signal path of the circuit. Preferably, the electronic subcircuit comprises a two-transistor current mirror using bipolar or field-effect transistors. Preferably, the electronic subcircuit further comprises a differential pair of transistors. The analog subcircuit comprises a part of the analog signal processing portion of the cell. The analog subcircuit adds switching capability without introducing additional switching devices into the signal path of the circuit.

There is further provided a programmable current-mode integrator/amplifier having a circuit based on the Miller effect, wherein the current-mode integrator/amplifier is capable of integrating or amplifying a current-mode signal input into a current-mode signal output. The current-mode integrator comprises a current buffer, having an input signal and an output signal, an operational transconductance amplifier (OTA) input stage, having an input signal connected to the output of the current buffer and an output signal, connected to a current amplifier, wherein the current amplifier comprises an additional voltage mode output, and a capacitor or a plurality of capacitors connected to the voltage mode output of the current amplifier and to the input of the OTA, whereby a feedback connection typical of the Miller integrator is created. The current-mode output of the amplifier is proportional to its voltage-mode output signal, which represents the integral of the input current-mode signal. In this feedback arrangement, the OTA works with a very small input voltage swing (provided that the gain in the loop is high) which provides for high linearity of the circuit. The circuit also has a high DC gain (up to 90 dB or more). In one implementation, the current-mode integrator comprises a highly linear, no feedback, current path having a Gilbert amplifier cell and a voltage feedback path with capacitors, realizing integration.

BRIEF DESCRIPTION OF THE DRAWINGS

FIG. 1A shows the local signal interconnections of the FPAA, FIG. 1B shows the global signal interconnections of the FPAA, FIG. 1C shows non-planar signal interconnections of the FPAA.

FIGS. 6A and B shows a current-mode integrator and sample-and-hold circuit.

FIGS. 7A, B show a programmable current mirror and a programmable differential pair. FIG. 7C shows a differential, current-mode analog demultiplexer with independent tuning of output weights, which contains a multi-output version of the circuit shown in FIG. 7B. FIG. 7D shows its block diagram symbol of the demultiplexer shown in FIG. 7C. The signals are depicted by single lines, even though they are preferably differential. FIG. 7E shows a schematic of a differential, current-mode analog signal multiplexer/summer with independent tuning of input weights. Additional summation (without independent tuning) is realized by connecting a number of signals to each input. FIG. 7F shows the block diagram symbol of the multiplexer/summer shown in FIG. 7E. The signals are depicted by single lines, even though they are differential. FIG. 7G shows a schematic and FIG. 7H explains the operation of a Zener diode D1 (FIG. 7G). The Zener diode is connected in the path of current signal in reverse direction, i.e., when the current I switch is off, the diode does not pass the signal. When the I switch is turned on, the diode enters the breakdown region (FIG. 7H), provided that the reverse voltage forced across the diode by the current source is sufficiently high, and the signal can now pass through the diode. Due to very small incremental resistance of the diode in the breakdown region this makes an almost ideal switch.

FIGS. 8A–E illustrate an example of constructing an FPAA for a matrix product tracking circuit. A circuit representing a class of circuits of interest is selected and its schematic diagram obtained. FIG. 8A shows the result of these steps. Next, a circuit labeled multi-graph for the matrix product tracking circuit is derived, as shown in FIG. 8B. The multi-graph is then generalized to a superset, as shown in FIG. 8C. In the current-mode, summing is performed on signal lines. Global signal interconnections are selected because if the matrices are scaled up, the number of nodes connected to the summing interconnections grows, so does the number of nodes connected to the input signal interconnections. The contents of the individual cells are then determined, as shown in FIG. 8D. Connections between the cells are made according to the graph of FIG. 8C, yielding a floor plan shown in FIG. 8E.

FIG. 11A shows how the elements of the filter of FIG. 9 can be grouped into "cells".

FIG. 11B shows how 11 "cells" of FIG. 11A, interconnected only locally, comprise the entire filter. This figure also demonstrates the topology of the realization of the filter in the inventive FPAA structure. Dashed lines represent inactive cells and signal interconnections. FIG. 11C shows the functionality of the FPAA cell in example 7.

FIG. 12A shows a block diagram of a single cell of an analog rank filter and FIG. 12B shows how it can be mapped into the structure of the inventive FPAA. Two cells of the FPAA are necessary to implement one cell of the rank filter. The left cell in FIG. 12B implements the left-hand part of the rank filter cell, and the right cell the right-hand part. One of ordinary skill in the art can identify functions performed by each cell in FIG. 12B. A required number of such cells can be placed next to each other to realize a rank filter circuit of arbitrary size.

FIG. 19A shows the implementation of a controller with m input variables and n fuzzy inference rules. FIG. 19B shows details of each rule implementation. Fuzzy membership function is implemented as a trapezoidal transfer function of the kind shown in FIG. 3C. Activation values $w_i$ are multiplied by centroid values of the fuzzy rules consequents $c_i$, and their areas $I_i$, yielding two sums computed on two horizontal global lines. The final expression for the defuzzified output variable $v_k$ is produced by a two-quadrant divider shown in FIG. 19C.

DETAILED DESCRIPTION OF THE INVENTION

Figure 1:
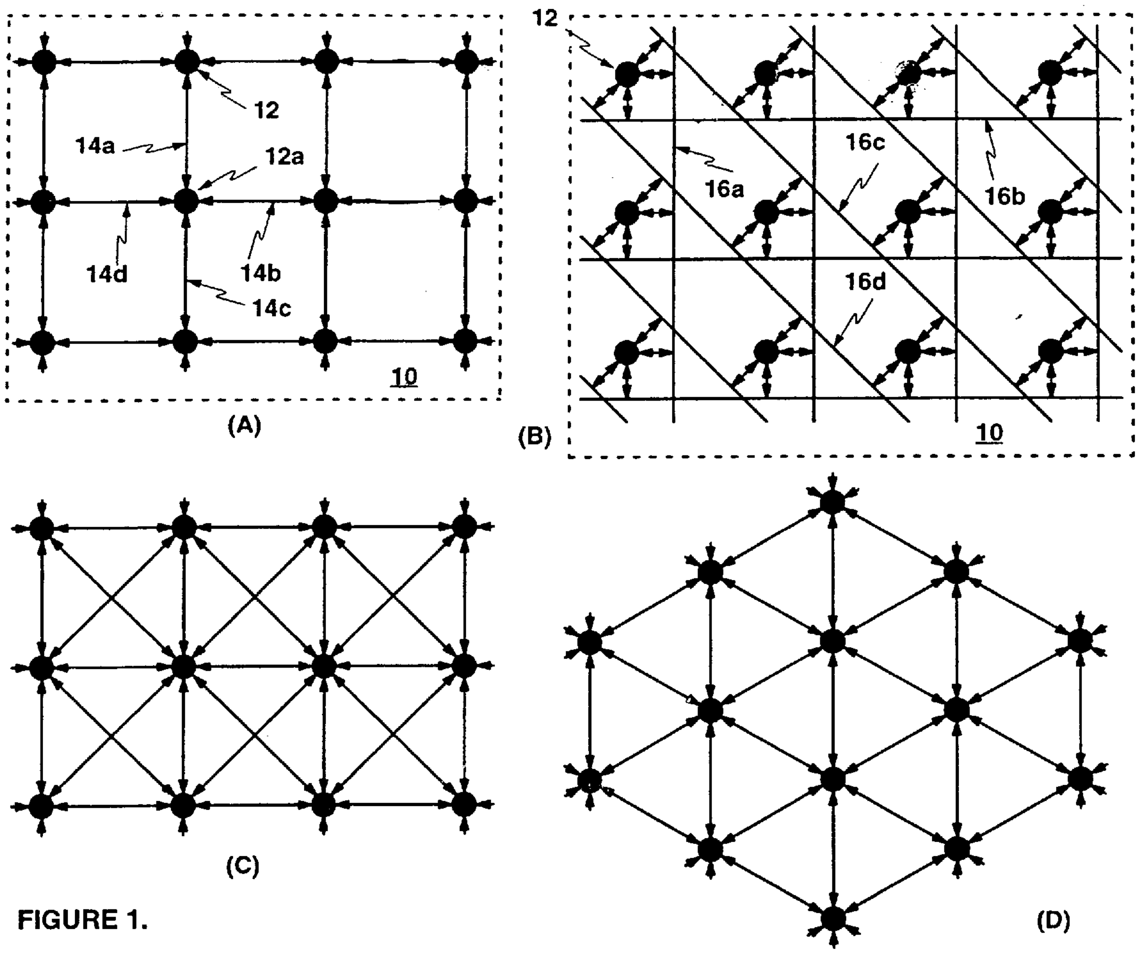
FIGS. 1A–C illustrate exemplary block diagrams of cells and local and global signal interconnections in field-programmable analog and mixed signal array devices. This illustrates a FPAA based upon a regular, square array of current-mode processing cells, interconnected on two levels, local and global. Each cell is connected to its four nearest neighbors by a two-way current-mode signal interconnection and is able to receive four different signals produced by those neighbors, whether all of them or just selected ones.
FIG. 1D shows hexagonal signal interconnections of the FPAA. The cell's own output signals are programmably distributed to the same four neighbors (FIG. 1A). The global interconnection pattern is superimposed on the local one, but it is shown separately to avoid clutter (FIG. 1B). Each cell can broadcast its output signals to any of the four global lines to which the cell is connected (possibly to more than one line at a time). The presented schemes of interconnections are planar. To allow realization of non-planar circuits in the FPAA, a non-planar structure of signal interconnections can be used. Such a structure can be easily obtained from any planar structure (such as that shown in FIGS. 1A and 1B) by adding non-planar connections (such as two diagonal connections shown in FIG. 1C).

As used herein, the following terms have the following meanings:

Analog signal (continuous signal) is a signal that can assume any value in a certain interval. Each value of the signal in such interval conveys useful information. All other types of signals are special cases of an analog signal.

Bipolar device is a bipolar transistor or diode.

Bipolar signal is a signal that can assume positive, as well as negative values; two-directional signal.

Continuous-time (c-t) signal is a signal which conveys useful information in every instance of time.

Current mode signal is an electric signal which is represented by a current in a circuit branch, or a mathematical function of a number of currents (such as a difference of two currents).

Digital signal is a binary (two-valued) signal.

Discrete-time (d-t) signal is a signal that conveys useful information (is defined) only at certain predetermined periods of time or points in time. At all other times the signal values do not necessarily convey useful information (the signal is undefined). Discrete-time signal may be associated with some kind of a clock signal, or a system of clock signals, and the time periods (points in time) when the signal is defined are sometimes referred to as clock ticks in which case it is a synchronous signal. If there is no clock signal, and the time periods when the signal is defined are determined in another way (e.g., as a sequence of events), the signal is called asynchronous.

Discrete signal (multi-valued signal) is a signal which can possibly assume any value from a certain interval, but only a finite number of such values (called levels) convey meaningful information. Depending on the particular purpose of the signal, values of the signal other than the levels are assumed to convey information of one of the neighboring levels, or to convey undefined (illegal) information. Multi-valued signal can have two levels in particular, in which case it is called a binary signal.

Embedding of a labeled multi-graph into another labeled multi-graph 1. a process of assigning groups of nodes and edges of a first graph to the groups of nodes and edges of a second graph, such that a number of nodes and edges of the first graph is assigned to a number of nodes and edges of the second graph.

2. a result of such process.

Floor plan is a general diagram showing location of circuit blocks or elements in space (or on a plane).

Global connections. A cells is considered globally connected in that the number of cells connected to a given cell by programmable analog signal connections connected to the cell changes when the number of cells in the structure varies.

Local connections. A cell is considered locally connected in that the number of cells connected to a given cell by programmable analog signal connections connected to the cell does not change as the number of cells in the structure varies.

Labeled multi-graph is a generalization of a graph, having edges incident with two or more nodes, and both edges and nodes having symbols assigned to them (those symbols are called labels).

Line (signal line) is the same as signal interconnection.

Mapping of a labeled multi-graph into another labeled multi-graph: an embedding where for each node and each edge of the first graph there is assigned exactly one edge and node, respectively, in the second graph, and the nodes and edges assigned to each other in the two graphs have matching labels.

Minimum embedding is an embedding of a circuit labeled multi-graph into an interconnection graph which does not lead to using cells as "wires" or "repeaters" i.e., cells programmed to merely transmit information (cells realizing only identity operation).

One-time programmability is one that can be applied only once.

Other Electron Devices mean electron devices having two, three, or more terminals, and displaying (a) linear or (b) nonlinear relationship(s) between electrical quantities such as voltage, current and charge, on those terminals, whereby the linear or nonlinear relationship is required to achieve amplifying, rectifying or similar operation, such as the operation of a transistor or a diode.

Port means a single entry point for the signal (input port), or an output point for the signal (output port). Since signals can be transmitted on a plurality of wires (e.g. pairs of wires), it is more convenient to talk about ports than about wires.

Programmability means an ability of a hardware device to perform a function or a composition of functions according to programming information, originating in the outside of the device. Programmability can be of software kind or of hardware kind. Software programmability does not necessarily involve changes in device's hardware characteristic. Hardware programmability involves such changes. Hardware programmability can be of two kinds: (i) tunability, which normally does not involve changes in the structure (configuration) of the device (structure of the signal path for signals processed by the device), also called parameter programmability, and (ii) structure programmability, involving changes in the structure (configuration) of the device (signal path for signals processed by the device). Finally, full programmability is programmability combining tunability and structure programmability. The term "reconfigurability" is used in literature to denote structure programmability.

Programmable circuit (device) is (1) a circuit (hardware device) exhibiting any kind of hardware programmability, or (2) a circuit (hardware device) exhibiting full programmability.

Repeated programmability is one that can be applied many times.

Voltage mode signal is an electric signal which is represented by a voltage between circuit nodes, or a mathematical function of a number of voltages (such as a difference of two voltages).

The present invention was made as part of an effort in designing analog programmable circuit architecture suitable for high-speed, high performance fully programmable analog operation. The highest performance can be achieved by reducing the length of signal interconnect lines, if possible, using only local signal interconnects. There is a tradeoff between the complexity of connections of a programmable device (and hence its functionality) and performance. Use of only local signal interconnects limits the class of such programmable analog devices to applications such as ladder continuous-time filters and other circuits. The present invention provides an architecture of a fully field-programmable analog array using primarily local signal interconnect architecture to create complex analog designs without compromising high-performance for the sake of functionality. Global interconnections can be incorporated into the inventive architecture and used only when absolutely necessary.

The control circuit, as used herein, includes, for example, a means for exchanging information to and from the control circuit, a means for storing information, a means for processing information, or a means for communicating with an associated analog processing portion of a cell. With such means, the control circuit is programmed to determine the operation of the analog processing portion of the cell. The analog processing portion of a cell, includes, for example, a means for performing one or more mathematical and other functions, including, but not limited to, weighted summing, multiplication, integration, exponentiation, logarithms, trigonometric functions, and the like.

The essential feature of the inventive device is that the length of the local signal interconnections in the array is minimized. Preferably, the cells of the array are arranged to minimize the length of local signal interconnections required to form the programmed device. Additionally, the total length of unprogrammed local and global signal interconnections is preferably minimized (for a given graph of connections between the cells). This architecture will minimize undesired noise effects and other signal distortions such as phase errors in the device.

The present architecture, described and exemplified herein, is suitable for the realization of a wide class of analog circuits. This specific architecture results from the general premise to use local signal interconnections whenever possible, and global signal interconnections only when absolutely necessary. The design of individual cells, and specific details of the architecture, were determined upon consideration of the perceived applications of the device, i.e., fast dynamic systems and fuzzy and multi-valued logic circuits. Although only continuous time examples are provided herein, the inventive device is capable of discrete-time operation as well.

The inventive device, and particularly, the inventive general purpose field-programmable analog array can be used for the implementation of various analog and logic circuits. We have shown that the realizations of MVL functions based upon orthogonal expansions as well as more general ones based on sets of not necessarily orthogonal functions, lead to regular circuit structures which can easily be mapped to the inventive FPAA. Other circuits, such as ladder filters, have the same property. Therefore, the inventive FPAA is an excellent tool for fast prototyping of various circuits and provides a skilled artisan with an opportunity to experiment with hardware realizations of various circuits without the necessity of their physical design and fabrication. The examples provided herein demonstrate the simplicity of realization of a wide class of such circuits, which also enables the implementation of design automation procedures.

Field-Programmable Array

FIGS. 1A and 1B illustrate structure (floor plan) of a field-programmable mixed (analog/digital) array (FPMA) or field-programmable analog array (FPAA). These arrays are based on a regular array (10) of programmable analog signal processing cells (12), interconnected at two levels: local (FIG. 1A) and global (FIG. 1B). The array shown in FIGS. 1A and B is for illustration only; regular arrays of various patterns may be utilized such as shown in FIG. 1C.

FIG. 1A shows the local signal interconnections (14) for interconnecting cells (12) of the array to form the programmable device. Each local signal interconnection (14) connects a fixed number of cells (12) together. That is, a signal interconnection is local in that the number of cells connected by the signal interconnection does not vary as the number of cells in the array varies. For example, in FIG. 1A, cell **(12*a*) is connected to its four nearest neighboring cells by two-way signal interconnections (14*a–d*). Cell (12*a*) is able to receive four different signals produced by these neighboring cells, collectively or selectively, and can distribute its output signal to the same four neighboring cells. If the size of the array (10) were increased by adding additional cells to the array's borders, the number of cells connected by local signal interconnections (14*a–d*)** does not change.

FIG. 1B shows a pattern of global signal interconnections (16) superimposed on the pattern of local signal interconnections (14). Each cell (12) can broadcast its output signal to one or more of four global interconnection lines **(16*a–d*) to which the cell is connected. Unlike local signal interconnections, a signal interconnection (16) is global in that the number of cells connected by the signal interconnection changes as the number of cells in the array (10) varies. For example, if a row of additional cells (12) were added to the upper border of the array, one of those cells would connect to global interconnection (16*a*)**.

Typically, a cell will have only one output signal, the same signal being distributed to the local neighbors and to the global lines, although in a general case a cell can produce a plurality of output signals (by outputting signals from various processing blocks of the cell). If a plurality of different output signals is produced, different signals can be sent to different destinations (i.e. local neighbors or global signal lines).

In the preferred current-mode realization of global signal lines, the signals sent to a given global line by different cells are summed on those lines (by virtue of Kirchhoff's Current Law (KCL)). Also, each cell can receive signals from global lines to which it is connected, selectively (from some lines) or collectively (from all lines). The signals from global lines can be received by single or multiple cells, although single cells are preferred. If a signal from a global line is received by more than one cell, it gets divided evenly by those cells, e.g. if n cells receive signal X present on a global line, each cell actually receives signal X/n. Whether one or more cells receive a signal from a global line, is determined in the process of programming the input multiplexer/summers of the receiving cells.

Each cell can broadcast its output signal to any of the four global lines to which the cell is connected (possibly to more than one at a time). If the signals are in a current-mode, they are summed on the global lines, and if more than one cell receives the signal from a given global line, the signal will be divided evenly by the receiving cells. Each cell can then send and receive signals to and from any of its four nearest neighbors and any of the global lines to which it is connected. In the example of FIG. 1, each cell has eight input ports and one output port (or eight output ports with copies of the same output signal).

The input and output signals of cell can be (i) in voltage or current form, (ii) single-ended or fully differential (balanced). The first choice (voltage or current) will lead to four classes of cells: voltage-to-voltage, voltage-to-current, current-to-voltage, and current-to-current. A differential mode input will preferably imply a differential mode output and vice-versa, although one can create cells with, for instance, differential input signals, and a single-ended output signal. At least eight types of cells can be created: the four types listed above for single ended signals, and the same types for fully differential signals.

Selection of the type of signals will be based among other criteria on the required interconnections between cells in the structure of the programmable circuit device. If the output signal of a given cell needs to be distributed to many places in the structure, it is more convenient to have it in voltage form, although current form can be used as well. If, on the other hand, summing of output signals of several cells is desired, current output signals are better. Current mode signals are generally more immune to noise and are usually faster. Therefore, a current-to-current cell design is preferred. The presented architecture and principles can be used for the design of an FPAA with cells using other signal combinations (voltage-to-voltage, etc.).

Programmable Cell

Figure 2:
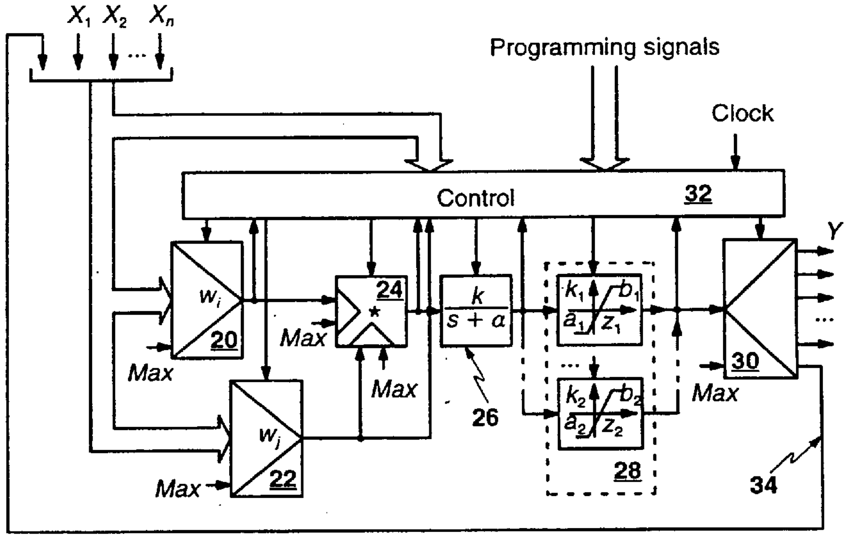
FIG. 2 illustrates an exemplary functional block diagram of a cell within the array, showing an analog signal processing portion and a control circuit. The design of the cell is a result of a compromise between the circuit's power and its simplicity. The illustrated cell processes current-mode differential signals. The analog processing portion provides required operations on signals processed by the cell. The control circuitry determines the operation of analog processing portion: the operations performed by the analog blocks and the parameters of analog blocks based on the feedback received from the analog processing portion and the programming signals.

The Analog Signal Processing Portion. A block diagram of cell is shown in FIG. 2. Preferably, the cell processes current-mode differential signals. The cell has two essential parts: a signal processing portion and an associated control circuit (32). The associated control circuit preferably is included within the body of cell, but can alternatively be located partly or wholly outside the cell body. All of the details of communication (e.g., signals from the processing portion to the control circuit) are not shown in FIG. 2 to avoid clutter but are described together with the control circuit. The signal processing portion may include a number of subcircuits that provide desired signal processing functions, such as a multiplier (24), an integrator (26), clipping circuits (28), and various support circuitry such as analog multiplexer/summers (20, 22) and analog demultiplexers (30). A multiplier, for example, may include a Gilbert multiplier cell combined with a wide band, current-mode amplifier, tunable in a wide range (such as 0–80 dB). The wide tunability range is required primarily by dynamic system type of applications, such as filters, differential equation solvers and others. The multiplier can perform other signal processing functions, such as phase detection and balanced modulation.

The multiplexer/summers selectively pass the input signals, multiplying them by the programmable weights $w_i$ and $w_j$, which can be positive, negative or zero, and then summing. Two input sums (one from each multiplexer/summers) are then passed to the multiplier. Therefore, a product of two independently selected sums of input signals is created. If no multiplication is desired, a constant signal (Max,±Max representing the range of the signals processed by the cell) is selected and fed to an input of the multiplier, or Max is selected on the input of one of the multiplexer/ summer. Each of the input or output ports can be independently turned off by means of programming the input multiplexer/summer or the output demultiplexer.

An integrator (26) has a programmable pole $\alpha$, which can be turned down to a value as close to zero as a practical circuit realization allows, in order to realize an "ideal", or "lossless" integration. It can also be programmed to a non-zero value (in the range depending on a particular circuit implementation) to realize "lossy" integration (a single-pole circuit function). Finally, the integration function can be programmably bypassed internally in the integrator, and the circuit realizes amplification function only, with gain programmed in a wide range, such as 0–80 dB. The integrator can be used as a short-term analog memory or a sample-and-hold circuit.

In a preferred embodiment, the analog processing portion comprises two multiplexer/summers, a multiplier, a programmable integrator/amplifier, a number of clipping (saturation) blocks, and an output demultiplexer. Each of the multiplexer/summers produces a weighted sum of the input signals. The weights, which can be positive, negative, or zero, are determined by the control circuit. A constant signal, Max,±Max representing the range of the signals processed by the cell, is connected to one input of each multiplexer/summer. This allows the multiplexer/summers to produce more variety of its output signals (for instance complements of signals to Max). The two sums (from the two multiplexer/summers) are fed to the multiplier block. On each of the inputs of the multiplier block a signal from a multiplexer/summer or a constant value Max can be selected. This allows bypassing the multiplication (when Max is selected on one input of the multiplier). When Max is selected on one input of the multiplier, the corresponding multiplexer/summer can be used for the calculation of weighted sums or complements of signals used by the control block. Each clipping block provides limiting of the output signal of the cell between two independently programmable values a and b, $-Max \leqq a \leqq 0$, $0 \leqq b \leqq Max$, as well as programming the zero z of the characteristic and its slope (gain) k.

The control block, preferably, not only sends control signals to the analog processing blocks, but also receives output signals from those blocks. This feedback allows the control block to perform comparisons and other operations on the analog signals processed by the cell in order to produce more variety of control signals and more variety of functions realized by the cell.

The programming signals connected to the control block from the outside of the cell determine the operation of the control block, and via control block—the operation of the entire cell. The clock signal(s) allow(s) discrete-time operation of the cell, if desired.

Through a feedback connection (43), the output signal can be connected to the inputs of the cell, which is required for certain circuits for certain applications. The output demultiplexer produces the desired number of copies of the output signal Y.

Figure 4:
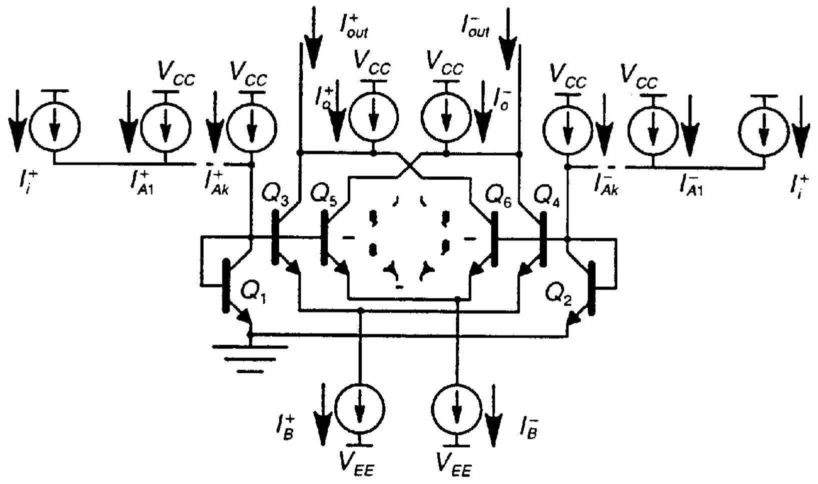
FIG. 4 shows an elementary building block of the cell based on the Gilbert current amplifier cell. In its simplest form the circuit comprises only transistors $Q_1$–$Q_4$ and current source $I_B^+$. Current sources $I_A$ represent the circuits input signals.

FIG. 4 shows a preferred embodiment of the elementary building block of the cell. In its simplest form the circuit contains only transistors $Q_1$–$Q_4$ and current source $I_b^+$. Current sources $I_A$ represent the circuit's input signals. The circuit is fully differential, i.e., both input and output signals are represented by differences of currents in two wires. The sum of currents $I_A^+$, which can be expressed as $I_A(1+X)$ is the positive "half" of the input signal, and $I_A^-$, which can be expressed as $I_A(1-X)$, is the negative "half". The input signal is then $I_A(1+X)-I_A(1-X)=2I_AX$, wherein X is called a modulation index. Likewise, the output signal is the difference $I^+_{out}-I^-_{out}$, expressed as $I_B(1+Y)-I_B(1-Y)=2I_BY$. Current gain is determined by the ratio $I_B/I_A$ and in practice can be tuned over several decades from a fraction of unity to about 10. The circuit has an excellent linearity and a wide bandwidth, limited by the $f_T$ of the transistors. In a bipolar process used for prototyping, $f_T$ is of the order of 8 GHz and the simulated unity gain bandwidth of this circuit is over 6 GHz.

Figure 3:
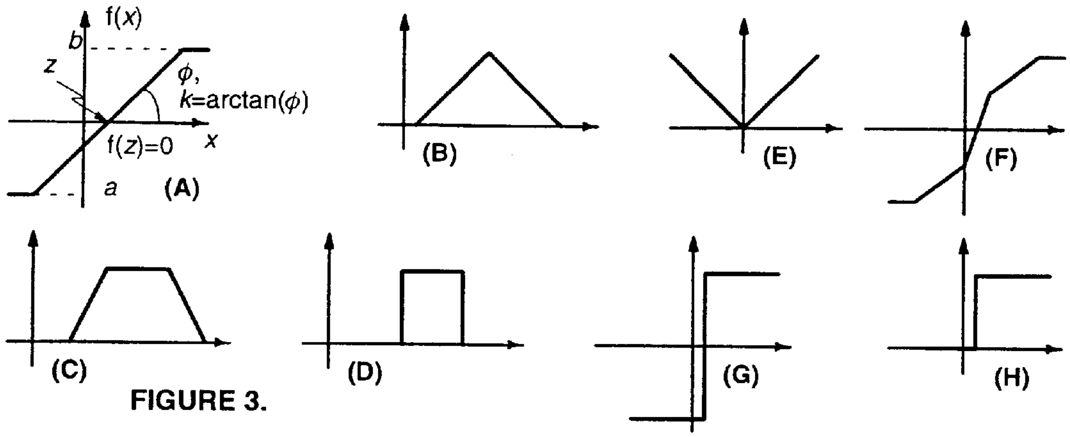
FIGS. 3A–H show exemplary DC transfer characteristics of the cell which are achieved by combining (summing) the characteristics of two clipping (saturation) blocks. Some of those characteristics are necessary for multi-valued logic (MVL) and fuzzy logic applications such as triangle or trapezoidal ones shown in FIGS. 3B, C.

FIG. 3A shows the DC transfer characteristic of the circuit of FIG. 4. The slope k in the linear range can be changed by adjusting the gain. The width and height of the linear range are determined by the currents $I_A$ and $I_B$ respectively. By adding (subtracting) currents on the input and on the output of the circuit (by additional programmed current sources, FIG. 4B) one can change the location of the zero z of the characteristic, as well as the two clipping (saturation) levels a and b.

This circuit has many variations. By including transistors $Q_5$ and $Q_6$, one achieves an ability to invert the signal (negative weight). If another input is connected in place of the tail current sources $I_B^+$ and $I_B^-$, a current-mode Gilbert multiplier is realized. More output (inner) transistor pairs can be added (dashed line) to obtain more independently tuned outputs.

Current-Mode Comparator

A current-mode comparator is a part of a current-mode cell of the FPAA. The comparator is shown in FIG. 5B. It comprises two differential current-mode inputs $I_A=I_A^+-I_A^-$ and $I_B=I_B^+-I_B^-$, two constant current sources $I_C$, and a current mirror $Q_5$, $Q_6$. It produces a single-ended voltage signal $V_{out}$, representing logical value of the Condition $I_A>I_B$. It operates as follows: The two input current-mode differential signals $I_A$ and $I_B$ (in FIG. 5B produced by differential pairs $Q_1$, $Q_2$ and $Q_3$, $Q_4$, such as the ones found at outputs of an analog multiplexer/summer, shown here to demonstrate how the comparator may be connected to analog circuitry of the cell), are connected to constant current sources $I_C$. By virtue of KCL, $I_1=I_C-I_A^--I_B^+$, and $I_2=I_C-I_A^+-I_B^-$. If $I_A>I_B$, it follows that $I_C-I_A^--I_B^+>I_C-I_A^+-I_B^-$ and consequently, $I_1>I_2$. For sufficiently high $\beta$ of $Q_5$, $I_5 \cong I_2$. The current mirror $Q_5$, $Q_6$ provides $I_5 \cong I_6$. Therefore with no load connected to the collector of $Q_6$, $V_{out}$ will be driven high (near the positive voltage supply $V_{CC}$), which represents desired output of the comparator. Analogously, it can be demonstrated that when $I_A<I_B$, the output $V_{out}$ will be driven low (near 0). A suitable output buffer can be added by those skilled in the art to provide sufficient drive for logic circuits connect to $V_{out}$, without causing undesired loading of the node $V_{out}$.

Analog Multiplexer/Summer and Analog Demultiplexer

FIG. 7E shows a schematic of an analog multiplexer/summer with independent tuning of input weights, in a differential, current-mode implementation. Additional summation (without independent tuning) can be realized by connecting a number of signals to each input.

A demultiplexer can be realized in a similar fashion by placing more inner (output) pairs of transistors (FIGS.. 7C, D). Circuits from this family can be connected is cascades by adding current sources (sources $I_C$ in FIG. 7E). Then the difference between the (constant) current sources $I_C$ from such sources and the output signal of one stage can be fed to the next stage. This arrangement is well suited to the $I_C$ fabrication process with good quality vertical npn devices and poor quality lateral pnp devices, as it has better frequency response. By cascading several stages based upon the circuit of FIG. 4, a wide-band current amplifier tunable in a wide range (such as 0–80 dB or more) is obtained.

Clipping (limiting) Blocks

Two (or more) clipping (limiting) blocks (28), shown in FIG. 2, are realized as single amplifier stages of FIG. 4B. With two blocks, one achieves many nonlinear characteristics, some of which are shown in FIGS. 3A–H.

Current-Mode Integrator

There is further provided a programmable current-mode integrator/amplifier having a circuit based on a Miller effect, wherein the current-mode integrator/amplifier is capable of integrating or amplifying a current-mode signal input into a current-mode signal output (FIG. 6). The current-mode integrator/amplifier comprises an operational transconductance amplifier (OTA) input stage (60), having an input signal and an output signal, connected to a current amplifier (62), wherein the current amplifier comprises an additional voltage mode output, and a capacitor or a plurality of capacitors connected to the voltage mode output (64) of the current amplifier and to the input of the OTA. The current-mode output of the amplifier is proportional to its voltage-mode output signal, which represents the integral of the input current-mode signal. In this feedback arrangement, the OTA works with a small input voltage swing (provided that the gain in the loop is high). Due to the feedback operation, the voltage on the capacitors is only slightly disturbed by any nonlinearities within the loop. Therefore, the linearity of the circuit is primarily determined by the linearity of the relationship between the voltage-mode and the current-mode output signals, which is good if there is proper design of the output stage.

The OTA input stage linearity is not critical. This design inherits all good features of a classical Miller integrator employing a voltage-to-voltage amplifier (an op amp). This design provides an ability to realize a low-frequency pole (ideally, an integrator's pole should be at zero) with a small capacitors value, mostly independent of the impedances of the source of the input signal and the load. This is because the capacitors see an extremely high impedance (typically of the order of tens or even hundreds of GΩ). In the traditional design of a current-to-current integrator, the Miller integrator (or even a capacitor) is followed by an OTA, converting the full range of voltages developing across the capacitor into the output current. In such a design, the linearity of the OTA limits the linearity of the integrator, even though (in the Miller integrator) the voltage on the capacitors is a nearly perfect linear integral of the input signal.

The pole can be moved by changing the operating conditions of the circuit. If a high frequency pole is desired, the output signal can be fed back to an additional input of the OTA to simulate resistors connected to the output.

The inventive circuit has additional advantages over the classical design. For example, the input signal can be fed directly into the current amplifier, making the voltage on the capacitors track the input signal. When desired, the input stage of the current amplifier can be turned off, and the capacitors will hold the last value of the signal, thus realizing the sample-and-hold function. Finally, when no integration or sample-and-hold operation is necessary, the voltage output is turned off and only the current amplifier is used. Then, the circuit works as a tunable amplifier.

Advantages of the exemplified current-mode integrator include (1) better linearity (the only intrinsically nonlinear part is the voltage-to-current stage (OTA input stage), which works with very small voltage swing and in a feedback loop), (2) good frequency response (the circuit is almost entirely current-mode, except for the two pairs of high-impedance points where the capacitors are connected). With C of 0.8 pF, the simulated frequency response shows its wide range of useful frequencies, wherein the phase response is tunable to −90°±0.5°, in the range of about 92 kHz to over 160 MHz. Operation up to about 670 MHz and more (depending on the technology) is possible in simplified design of the circuit shown in FIG. 20.

A current-mode integrator is shown in FIG. 6. The core of this fully-differential circuit comprises an OTA input stage of transconductance $g_m=I_2/V_1$ and a current amplifier gain of $k_2=I_{out}/I_2$, where $X_\alpha=X_\alpha^+-X_\alpha^-$, $X\epsilon\{V,I\}$, $\alpha\epsilon\{in, 1, 2, O\}$. The current amplifier has an additional voltage-mode output with associated transresistance $1/g_0=V_{out}/I_2$. Capacitors C are connected to this output and to the input of the OTA, thus realizing a Miller integrator. Simplified assumptions have been made in order to keep the analytical derivation of the integrator transfer function tractable. The output impedances for the voltage and current outputs of the amplifier are assumed to be equal to zero and infinity, respectively, and $g_m$, $g_0$, $k_2$ are assumed to have neither zeros no poles in or near the frequency range of interest. With the foregoing assumptions, the transfer function is derived as follows:

$$\frac{I_{out}}{I_{in}}=\frac{k_1k_2g_m}{s[(1+g_m/g_o)C+C_{pI}]+1/R_M(1+g_m/g_o)} \qquad (1)$$

where $g_m/g_0=V_{out}/V_1$ represents voltage gain in the loop, and:

$$R_M=(g_0+g_m)R_{in}/g_0=R_{in}(1+g_m/g_0)= \qquad (2)$$

represents resistance seen by the capacitors C, where $R_{in}$ represents input resistance of the OTA input stage. Substituting (2) into (1) yields:

$$\frac{I_{out}}{I_{in}}=\frac{k_1k_2g_m}{s[(1+g_m/g_o)C+C_{pI}]+1/R_M}. \qquad (3)$$

It follows that the DC gain of the integrator equals:

$$A_{DC}=R_{in}k_1k_2g_m, \qquad (4)$$

and the pole frequency is:

$$f_p=1/2\pi\cdot\frac{1/R_{in}}{(1+g_m/g_o)C+C_{pI}}. \qquad (5)$$

To maximize $A_{DC}$ and minimize $f_p$ one should maximize $R_{in}$, $k_2$ and $g_m$ and minimize $g_0$ (i.e., maximize both input resistance of the OTA and the voltage gain in the loop. High voltage gain in the loop additionally results in low $V_1$ swing, relaxing the requirements on the OTA linearity.

Additionally:

$$\frac{V_{out}}{I_o}=\frac{1}{k_2g_o}, \qquad (6)$$

where $$1/(k_2g_0)=R_E \qquad (7)$$

is a constant in the particular circuit implementation. Therefore, $k_2$ should not be used for tuning of the integrator, as its changes result in changing $g_0$. The gain of the input current buffer, $k_1$, should be used instead. The buffer has low input impedance and it isolates high-impedance input of the core circuit from the signal source, whose impedance is not critical for circuit performance. Additionally, the buffer blocks the common mode input signals. The output of the integrator has high impedance and can be connected to the input of another integrator.

Figure 20:
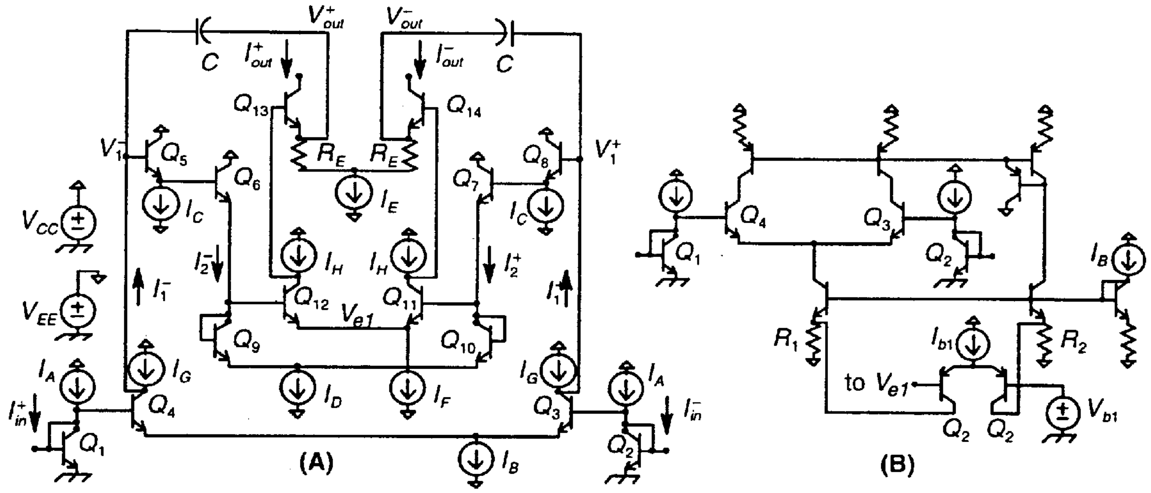
FIG. 20 shows an electrical schematic of an integrator. Transistors $Q_1 \div Q_4$ form a Gilbert "type A cell", working as the input buffer with current sources $I_A$ biasing the input pair $Q_1$, $Q_2$. This circuit is characterized by excellent linearity and high bandwidth (simulated −3 dB bandwidth for unity gain is better than 6 GHz). Transistors $Q_5 \div Q_8$ realize the OTA input stage. The current-mode amplifier, again based on the Gilbert "type A cell" is realized by $Q_9 \div Q_{12}$. Loaded by current sources $I_H$, it provides high voltage gain. Its output voltage signal is connected to the emitter follower $Q_{13}$, $Q_{14}$, providing an output current, $I_{out}$, and output voltage connected to the capacitors.

A simplified schematic of a particular implementation is shown in FIG. 20. Transistors $Q_1 \div Q_4$ form a Gilbert "type A cell", working as the input buffer with current sources $I_A$ biasing the input pair $Q_1$, $Q_2$. This circuit is characterized by excellent linearity and high bandwidth (simulated unity gain frequency is better than 6 GHz). The buffer blocks common-mode input signals and provides tunability of $k_1$, at least in the range of −20 dB to 20 dB (by means of changing the ratio $I_A/I_B$). Current sources $I_G$, are necessary to achieve high impedance at the OTA input and eliminate the common-mode component of the collector currents of $Q_3$ and $Q_4$. Transistors $Q_5 \div Q_8$ realize the OTA input stage. Changing $I_C$and $I_D$ allows tuning of $g_m$. The current-mode amplifier, again based on the Gilbert "type A cell" is realized by $Q_9 \div Q_{12}$. Changing $I_D/I_F$ allows tuning of $k_2$ over at least 40 dB. Active loads $I_H$ provide required voltage gain in the feedback loop. The voltage signal is connected to the emitter follower $Q_{13}$, $Q_{14}$, providing also an output current. Linearity of the emitter resistors $R_E$(Eq. 6, 7) in the follower is critical to the linearity of the integrator.

For proper operation, the circuit contains two common-mode feedback subcircuits, one of which is shown in FIG. 20B. Their function is to assure adequate DC voltages at the two pairs of high-impedance points in the integrator, that is at the collectors of $Q_3$, $Q_4$ and the collectors of $Q_{11}$, Q12. The circuits sense voltages on the emitters of the respective current gain cells and compare them with constant voltages, $V_{b1}$ and $V_{b2}$. Any mismatch of the collector currents at the high-impedance points is corrected by adjusting the base-emitter voltages of the respective current mirror transistors, by means of dumping additional current onto their emitter resistors ($R_1$ and $R_2$ in FIG. 20B). The gain of the common-mode feedback circuits can be adjusted by changing the tail currents $I_{b1}$ and $I_{b2}$.

Figure 21:
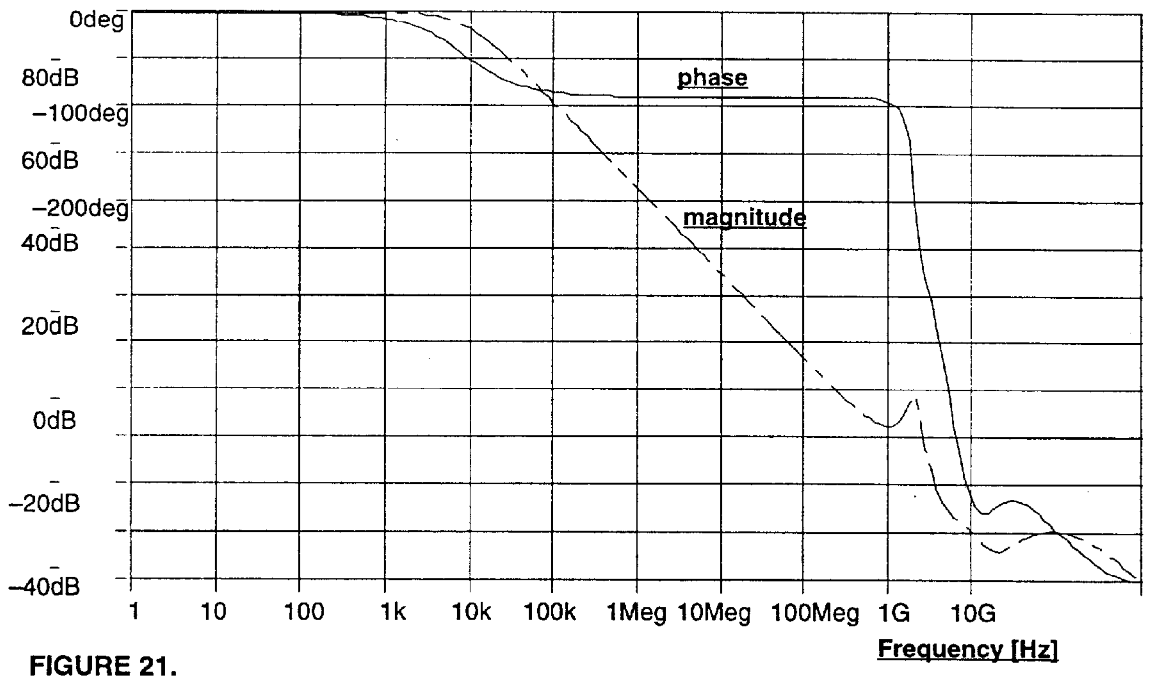
FIG. 21 shows the frequency response of the integrator of FIG. 20.

The foregoing illustrative circuit was tested by computer simulation. With C of 0.8 pF, the circuit phase response of −90±0.5° in the range of 1 MHz to 670 MHz (FIG. 21). The gain was adjusted by changing the tail current $I_B$ of the input buffer (FIG. 20). The low-frequency pole was moved down to about 3 Hz by changing the operating conditions of the circuit. With sufficiently high gain in the feedback loop, the circuit had THD of less than 0.052% for an output signal current of over 2.8 $mA_{pp}$ (Table 1).

TABLE 1

(fourier components of transient response v(472), dc component = 2.053045 u)

| har # | fr (hz) | f. comp. | norm. comp. | phase (deg) | norm. phase (deg) |
|---|---|---|---|---|---|
| 1 | 1 meg | 2.83007 m | 1 | −89.5103 | 0.0 |
| 2 | 2 meg | 20.7095 n | 7.31765 u | −35.539 | 53.9713 |
| 3 | 3 meg | 1.39641 u | 493.42 u | 89.3294 | 178.84 |
| 4 | 4 meg | 10.1036 n | 3.57009 u | −29.9165 | 59.5939 |
| 5 | 5 meg | 377.752 n | 133.478 u | 92.0383 | 181.549 |
| 6 | 6 meg | 6.55656 n | 2.31675 u | −17.5831 | 71.9272 |
| 7 | 7 meg | 142.415 n | 50.3223 u | 103.293 | 192.803 |
| 8 | 8 meg | 4.76799 n | 1.68476 u | −5.9138 | 83.5965 |
| 9 | 9 meg | 60.2923 n | 21.3042 u | 111.27 | 200.781 |

total harmonic distortion = 51.4 m percent

Emitter area mismatches in the current gain cells will lead to nonlinearities which can be eliminated by applying measures described in Gilbert (*J. Solid State Circuits* SC-3:353–365, 1968). Mismatches of emitter resistors in the current sources can be eliminated by applying correcting currents in a similar manner as in common mode feedback circuits. Proper values of $R_E$ resistors are important for high frequency operation of the circuit because of a parasitic pole-zero pair near 500 MHz. However, even considerably higher departures from required values can be corrected by changing current $I_E$. $I_E$ can also be used to correct excess phase.

The foregoing illustration of a current-mode integrator illustrates the invention. The illustrated circuit combines good properties of voltage-output Miller integrator with excellent linearity and speed of gain cell. The design is a core of a programmable amplifier-integrator for a FPAA described below. Also voltage output from the integrator is possible if desired.

Figure 22:
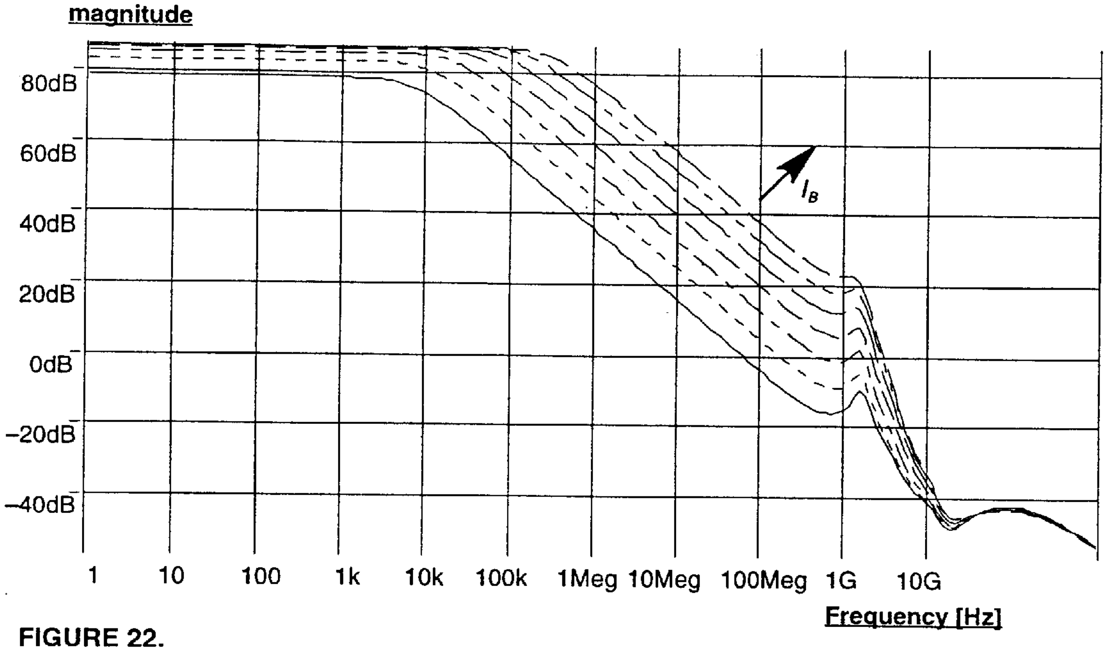
FIG. 22 shows tuning the gain of the integrator of FIG. 20.
Figure 23:
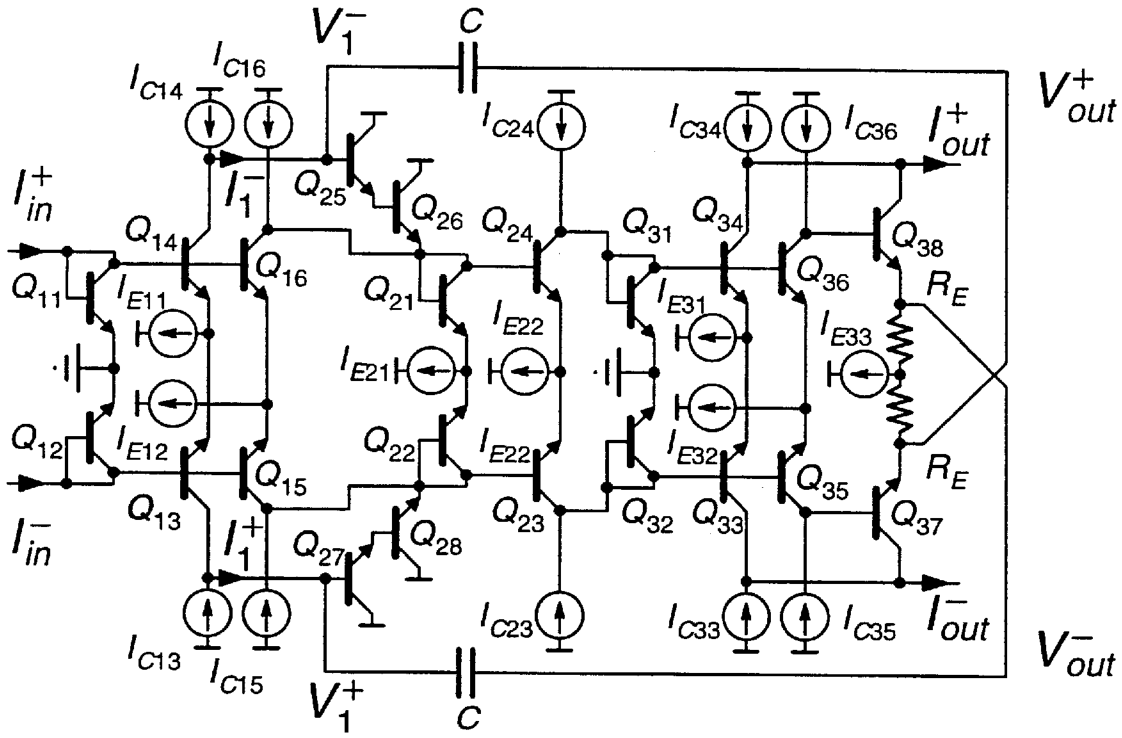
FIG. 23 shows an implementation of a programmable current-mode amplifier/integrator, based on the inventive current-mode Miller integrator design (the block diagram of the amplifier/integrator is shown in FIGS. 6A, B).

The Amplifier/Integrator can also work as a sample-and-hold circuit. To attain sample-and-hold operation the entire circuit is activated, as opposed to using only parts of it in the amplifying mode and in the integrating mode (FIG. 23). The parts indicated by dashed line in the figure are all active. In such a case there is a direct path from the input to the output, and the circuit realizes a transfer function a/(sC+b)+d, where a, b, and d are constants. By changing bias currents in the circuit ($I_{E11}$ through $I_{E33}$ and $I_{C13}$ through $I_{C36}$ in FIG. 22) one can change a, b, and d in the above equation. For the sample mode, when the circuit follows the input signal, it is desired to have a as small, and b and d as large as practically possible. Then the voltage on the capacitors follows the changes in the input signal. When it is desired that the circuit entered the hold mode, $I_{E11}$, $I_{E12}$, and $I_{C13}$–$I_{C16}$ (FIG. 22) are turned down to zero. Then the circuit holds the last value of the signal, working as an integrator with no input signal (because the input signal has been disconnected by deactivating bias current sources $I_{E11}$, $I_{E12}$, and $I_{C13}$–$I_{C16}$). The held value is available as the output current.

Figure 26:
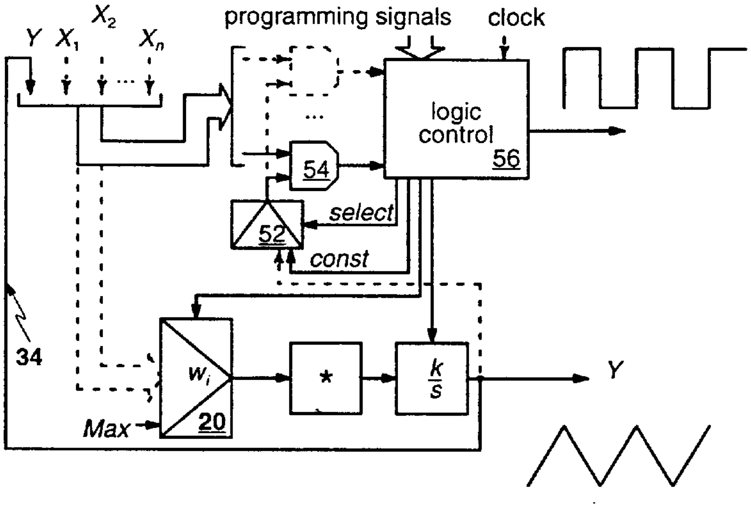
FIG. 26 demonstrates an application of a single cell of the inventive device as a digitally-controlled oscillator. The const value is downloaded to the logic control block via the programming signals connection.

FIG. 26 demonstrates the application of a single cell of the inventive device as a digitally controlled oscillator. The const value is downloaded to the logic control block via the programming signals connection. The multiplexer/summer 52 is programmed to pass const to the comparator 54. The other input of the comparator 54 is connected to the output signal Y via the feedback connection 34. The input multiplexer/summer 20 is programmed by the logic control block to produce a scaled constant value derived from Max. This constant value is fed to the input of the integrator via the multiplier (which has Max connected to its second input, not shown in the figure to avoid clutter). In this arrangement the multiplier passes its input signal to the integrator. Thus the integrator receives a constant signal, which causes it's output signal to ramp up. When the output signal Y of the integrator rises to the level equal to const, the comparator sends a signal to the logic control block. Then the logic control block reverses both the weight of the input multiplexer/summer 20, and the value of const. The first event results in feeding a constant signal of opposite polarity to the input of the integrator. This in turn causes the output signal of the integrator to ramp in opposite direction, i.e. down. When it crosses -const, the above cycle starts over again, which yields a triangle waveform on the output Y. One of the internal signals in the logic control block represents the sign of const. The changes of this signal comprise a square waveform synchronous with the triangle waveform observed on the integrator's output. This square waveform can be communicated to other cells via the connections existing between control blocks in the array.

Alternatively, it can be used to program the weights of the output demultiplexer 30 of the cell (FIG. 22), so that it outputs a constant derived from Max (by turning on only the weight associated with Max), or that constant negated in the second half of the waveform cycle. Numerous variations of the above presented scheme of waveform generation can be easily derived by those skilled in the art. One can manipulate the values of const, −const, the weights of the multiplexers and demultiplexers, the gain k of the intergrator (all that by downloading appropriate programming information to the logic control block), to achieve waveforms with duty cycle other than 50% (sawtooth in particular), or with absolute values of the maximum and minimum levels equal to each other or different, as desired.

Figure 27:
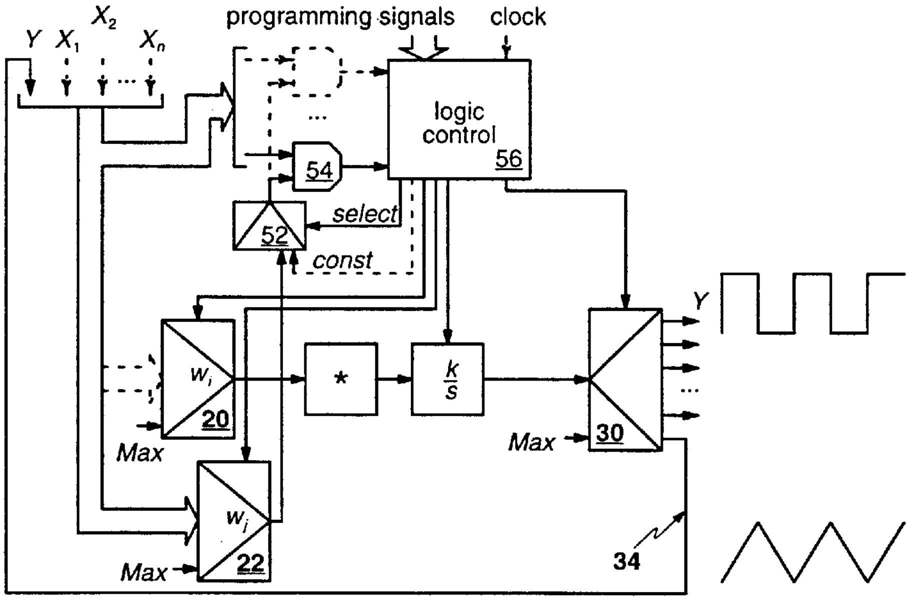
FIG. 27 illustrates another variation as a signal-controlled oscillator. It is based on using one of the input signals $X_1$, n . . . , $X_n$ (or a mathematical function thereof, see Table 2) instead of const to be compared against the output of the integrator. In this case, one of the input multiplexer/summers (e.g., 22) is used to derive the desired signal to be used for comparison in place of const.

Another variation of the presented scheme is based on using one of the input signals $X_1, \ldots, X_n$ (or a mathematical function thereof, see Table 2) instead of const to be compared against the output of the integrator. In this case one of the input multiplexer/summers (e.g., 22, FIG. 27) would be used to derive the desired signal to be used for comparison in place of const. This value would then be selected by the multiplexer/summer 52 instead of const. The other multiplexer/summer would work as in the scheme described above. This way an oscillator controlled by a(n) (combination of) input signal(s) would be attained (what is known in the art as VCO, voltage-controlled oscillator, even though strictly speaking this would be a current controlled oscillator, since the signal is in current mode in the preferred embodiment of the cell). Again, numerous variations of this modified oscillator scheme could be easily derived by those skilled in the art.

Other schemes of controlled waveform generation are possible. One can connect two cells of the FPAA to implement a circuit with two conjugate poles on the imaginary axis of the complex plane to generate a sinewave. Such circuit would require both cells to be programmed to perform integration. Appropriate scheme of parameter adjustment to achieve a stable waveform of desired frequency and amplitude could be easily derived by those skilled in the art. Another application of the inventive device, related to the controlled oscillators described above, is a phase-locked loop (PLL). PLL typically comprises a VCO, a low-pass filter, and a phase detector. A phase detector can be realized by a single cell of the inventive device, whereby the Gilbert multiplier block would be used as a phase detector (e.g., Alan B. Grebene, Bipolar and MOS Analog Circuit Design, John Wiley, 1984). Other blocks can be realized easily in the structure of the inventive device, and connected appropriately to implement a PLL.

Control Block Portion

The control block stores programming information (loaded to it via a control signals connection) and sends programming signals to the analog processing blocks of the cell. One way to arrange storage of information is by means of digital memory, such as RAM. Another way is by storing electrical charge on floating gates of MOS devices, such as EEPROM cells. Programming signals sent to the analog processing blocks can be derived by methods known in the implementations of digital-to-analog converters (DACs). Since the control block has access to input and internal signals of the cell as well, it can produce control signals as a function of instantaneous input and internal signals values. This feature of the control block is important for certain operations, such as a minimum (maximum) follower (min, max).

Figure 5A:
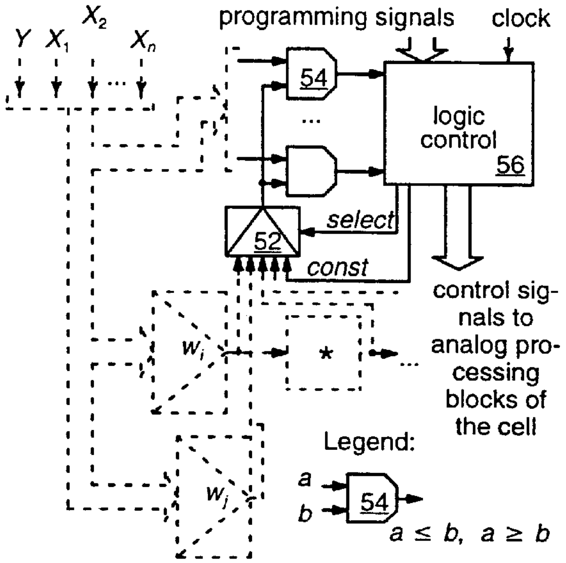
FIG. 5 is an exemplary functional block diagram of the control circuit of the cell shown in FIG. 2. The control block directs the operation of the analog processing circuits of the cell and enhances functionality of the cell, enabling nonlinear operations such as a min/max follower, signal-controlled generation of programmed waveforms, signal-to-frequency conversion (VCO), and MVL operations.
FIG. 5B shows a current-mode comparator as a part of a current-mode cell of the FPAA. It comprises two differential current-mode inputs $I_A=I_A^+-I_A^-$ and $I_B=I_B^+-I_B^-$, two constant current sources $I_C$, and a current mirror $Q_5$, $Q_6$. It produces a single-ended voltage signal $V_{out}$, representing logical value of the condition $I_A>I_B$.

FIG. 5A shows a preferred embodiment of the control block. It contains a logic control circuit, which can be realized as a combinatorial circuit or as a finite state machine such as those known in the art, and may contain logic circuits, registers, RAM cells, EEPROM cells, DACs, and other elements typically used in digital and analog-digital (mixed-mode) circuits known in the art. Further, the control block comprises a number of comparators for comparing signals in desired mode (e.g. current-mode), having analog inputs and digital outputs, and an analog multiplexer/summer, such as the one described above. One input of each comparator is preferably connected to one of the input signals, while the other input is connected to the output of the multiplexer summer. The multiplexer/summer's select input is controlled by the control circuit. The inputs of the multiplexer/summer are connected to the internal signals of the analog processing part of the cell (i.e. the output signals of the analog processing blocks of the cell). Additionally, a constant signal created by the control block is connected to one input of the multiplexer/summer. Thus the control circuit can choose one of the internal signals processed by the cell or its own programmed constant to be compared with any of the input signals $X_1, X_2, \ldots, X_n$, (or the output signal Y, which is connected to the input of the cell via the feedback connection 34). The outputs of the comparators are connected to the control circuit.

The control circuit programmably operates to compare the analog input signals (or the output signal) against one of the values produced by any of the analog processing blocks or their weighted sum obtained in the multiplexer/summer 52. In one implementation, the comparators each produce two binary signals corresponding to the conditions $a \leqq b$ and $a \geqq b$, where a and b are input signals to comparators. Two signals of equal value on the output of a comparator indicate equal input signals. A preferred implementation of current-input comparator is shown in FIG. 5B. Ordinary comparators, such as those known in the art, can be used instead. In this way, control circuit produces control signals as a function of certain conditions of instantaneous input and internal signal values (e.g., equality of two or more signals, relationship between a number of signals and zero or another constant).

This feature also realizes minimum and maximum followers (min, max), absolute value (abs), and other operations. To realize min and max operations, the control circuit detects the smallest (largest) signal and selects this signal on the input of cell. This selection is accomplished by comparing the output signal of the selected multiplexer with the input signals. If one or more of the input signals is smaller (larger) than the multiplexer output, the control circuit sends appropriate signals to the multiplexer to adjust its weights until the smallest (largest) signal is selected. When realizing the absolute value function, control circuit changes the sign of input weights if the weighted sum is negative.

Variations of the presented cell can be derived. By changing the arrangement of the blocks comprising the cell, the functions of those blocks, or the physical nature or type of the signals, one can obtain equivalent designs of the cell. In particular, one can design a cell having voltage input signals and current output signals, simply by adding appropriate front-end and back-end circuits such as OTAs. Alternative cell implementations, namely voltage-to-current, voltage-to-voltage and current-to-voltage versions of the cell, can be built. The design decision as to the physical nature of the input and output signals of the cell has an impact on the design of the interconnection network of the programmable circuit device. For instance, voltage output signals can be, in principle, easily distributed to multiple inputs of other cells. Current output signals, on the contrary, work best if they are "sent" to one destination only. Therefore, if one output signal in current form needs to be distributed to several cells' inputs, preferably only one of those cells opens its input port for the current. Alternatively, the output current may be mirrored (copied), for instance by an analog demultiplexer such as the one presented above, and individual copies sent to the several cells' inputs. Also, signals of current form can be freely added in electrical nodes, which is not possible for signals in voltage form.

The topology of the circuit realized in the programmable device (the mapping of the circuit into the structure of the programmable device) is independent of the physical nature of the input and output signals of the cells of the programmable device. It is determined by the flow of signal in the circuit. That is, if a mapping of a given circuit to the resources of the programmable device of a given arrangement of physical natures of signals (e.g., current-to-current) is known, the same mapping can be used for this circuit if it needs to be implemented in a programmable device of a different arrangement of physical natures of signals (e.g., voltage-to current), with the possible exception of the additions performed in current-mode on signal lines by virtue of KCL, which would have to be implemented differently in voltage mode.

Some operations, important for dynamic systems, multi-valued, fuzzy and other logic applications, performed by cell are summarized in Table 2 below. $X_i$ denotes inputs signals and Y denotes an output signal. The symbol k represents a programmed constant (gain). No distinction is made between local and global signals, since the cell processes them in the same manner.

TABLE 2

| | | |
|---|---|---|
| 1 | $Y = k\left(\sum_{w_i \in W_1} w_i X_i\right)\left(\sum_{w_i \in W_2} w_i X_i\right)$ | $W_1$ and $W_2$ are independent sets of input weights, k is tuned in a wide range such as 0–80 dB. Complements of the signals (to the maximum possible signal value, Max) can be calculated. |
| 2 | $Y = k\left(\sum_{i \in W} w_i X_i\right)$ | |
| 3 | $Y = k\ X_i\ X_i$ | |
| 4 | $Y = k\ X_i^2$ | |
| 5 | $Y = k \min(X_1 \ldots X_n)$ | The control block "watches" input signals and selects the smallest one. |
| 6 | $Y = k \max(X_1 \ldots X_n)$ | |
| 7 | $Y = k\ Y_{1-6}\ 1/s + \alpha$ | $Y_{1-6}$ is any of the functions presented in rows 1–6 above; $\alpha \geqq 0$. |
| 8 | $Y = a\ \mathrm{sign}(Y_{1-6})$ | a = b, k = ∞. |
| 9 | $Y = b\ U(Y_{1-6})$ | U denotes the step function. a = 0, b = Max, k = ∞. |
| 10 | $Y = k\ \lvert Y_{1-6}\rvert$ | |
| 11 | $Y = X_i$ | Identity. |

The cell performs summing of input signals selected by the control circuitry, multiplication of two signals (squaring of one signal), or multiplication of two independently derived weighted sums of input signals. Further processing includes lossless or lossy integration, and clipping, max, min, etc. These functions are important for implementation of continuous-time dynamic systems, and multi-valued, fuzzy, and continuous (such as Lukasiewicz) logic circuits.

The inventive architecture of the device is motivated by the desire to enable circuit realizations with minimal signal delays. Examples include an elliptic eighth-order ladder bandpass filter (Tan, "Design and Automatic Tuning of Fully Integrated, Transconductance-Grounded Capacitor Filters" Ph.D. Thesis, Univ. Of Minn. 1988), a rank filter cell (Paul et al., "A Simple Analog Rank Filter", *ISCAS*, pp. 121–24, 1992), a circuit for tracking the product of two matrices, a circuit for tracking a solution of a system of linear equations, a circuit for tracking a solution of a linear programming problem by the method of steepest descent, and a fuzzy controller (Kosko, "Neural Networks and Fuzzy Systems. A Dynamic Systems Approach to Machine Intelligence", Prentice Hall, Englewood Cliffs, N.J., 1992).

Subcircuit Design

The programmable support circuitry within a cell are preferably designed to minimize parasitics incurred by introducing switching capability. Parasitics, such as additional resistance in the signal path and stray capacitances, would be unavoidable if switching devices of any kind available in IC technologies were used. The net result of these parasitics is the introduction of phase errors and other distortions in transmitted signals, which compromise circuit's performance, such as speed and accuracy. Therefore, the present invention, preferably, does not employ switches, directly in the signal path of the device, but uses circuits which attain switching function without additional switching devices in the signal path. FIGS. 7A–F show a number of preferred embodiments of circuits with switching capability that minimize such parasiticis. FIG. 7A, for example, shows the basic form of a programmable current mirror that includes transistors Q1 and Q2 and emitter degeneration resistors R1 and R2. The circuit 40 within the dashed box is a common current mirror with emitter degeneration. However, by connecting a current source $I_{switch}$ to the emitter of Q2, this circuit becomes programmable. When there is no current supplied by the source, the mirror 40 simply copies the input current $I_{in}$ into the output current out. When the $I_{switch}$ current source is turned on and supplies a current large enough to raise voltage on the emitter of Q2 sufficiently to turn Q2 off, the mirror shuts off. By controlling $I_{switch}$ one can control how deeply Q2 goes into cutoff. This way desired programmability of the signal path is realized. The programmability is attained without introducing any additional elements in the signal path, such as switches connected in series with other circuit elements. Therefore there is only a negligible degradation of performance of the circuit, caused by output capacitance of the current source. Since this capacitance is in parallel with other parasitic capacitances already present at this node, it does not change the local topology of the circuit, and the undesired effects it causes can be taken care of in the same way as for those capacitances. This is much easier than for series switches, which actually change the local topology of the circuit. The circuit of FIG. 7A then is a programmable one, with repeated programmability of the signal path attained substantially without sacrificing the circuit's performance, such as speed and accuracy.

A programmable analog electronic circuit according to the invention comprises a programmable electronic circuit that includes a signal path and one or more active devices such as transistors controlling signal flow through the signal path. Each active device has multiple operating points that determine the signal propagation characteristics of the device. The circuit also includes a source of control current or control voltage to a part of an active device in the circuit, the source being removed from the signal path. The source changes the operating point of the active device from one point to another by changing the delivered control current or control voltage sufficiently to switch the device on and off and thereby turn on and off the signal flow through the signal path of the circuit.

Another useful embodiment of the programmable support circuitry is shown in FIG. 7B. The circuit comprises a differential pair 42 (in the dashed box)—which in this figure is not a complete circuit but rather a generic building block from which many specific circuits are derived, by adding resistors, transistors, other differential pairs or other devices. The circuit in the dashed box is tunable/programmable by virtue of changing the current $I_{bias}$. To shut both Q1 and Q2 off, one needs to turn $I_{bias}$ down to zero. Then, additional current $I_{switch}$ can be provided to drive Q1 and Q2 deeper in cut-off.

FIG. 7C shows a programmable analog demultiplexer circuit 44. The circuit mirrors the differential current-mode input signal on a number of outputs. Each output signal is an amplified, attenuated, or identical copy of the input signal, depending on the values of bias currents $I_{bias}$. The bias currents can be tuned independently of each other. Each output can be turned off by turning off the corresponding bias $I_{bias}$,i or providing corresponding current $I_{switch,i}>I_{bias,i}$. The same concept of signal-path programming is used to build multiplexer/summers (FIGS. 7E, F).

FIGS. 7D and F show block-diagram symbols of the analog demultiplexer and multiplexer/summer blocks, respectively. FIG. 7G shows a schematic and FIG. 7H explains the operation of a Zener diode D1 (FIG. 7G). The Zener diode is connected in the path of current signal in reverse direction, i.e., when the current I switch is off, the diode does not pass the signal. When the I switch is turned on, the diode enters the breakdown region (FIG. 7H), provided that the reverse voltage forced across the diode by the current source is sufficiently high, and the signal can now pass through the diode. Due to very small incremental resistance of the diode in the breakdown region this makes an almost ideal switch.

Method of Creating an FPAA

The structures of individual FPAAs may differ depending on the class of analog circuits for which they will be used. A structure is determined in accordance with the following steps of a method. This method may be implemented in a number of ways, but preferably is carried out with a computer to reduce computation time. The present invention provides a method for designing a FPAA, comprising: (1) selecting a representative circuit from a class of circuits of interest (e.g., if the class of circuits is active filters, an example filter of reasonably high order is selected); (2) creating a schematic diagram of the representative circuit (e.g., the filter); (3) deriving a circuit labeled multi-graph from the schematic diagram; (4) adding nodes and edges to produce a superset of the multi-graph; (5) grouping together selected edges and nodes from the superset of the multi-graph to form an interconnection multi-graph of desired cells and determine the functionality of individual cells, (6) realizing a cell in a desired technology; and (7) determining connections between the cells. Such connections are made according to the multi-graph derived in #5 above and the cell contents. Some circuits can be scaled up and down (e.g. for filters, scaling usually means changing the order of the filter). In a matrix product tracking circuit, scaling means changing the sizes of input matrices. If in the process of scaling the circuit up and down the number of edges incident with a single cell (the cell represented by a number of nodes of the superset of the circuit labeled multi-graph) changes, these edges should be realized as global connections. If, on the other hand, in the scaling process the number of such edges does not change, they should be realized as local connections. With the addition of control circuit in one of the ways described above, a field-programmable mixed array device is now complete, constructed for a particular class of circuits.

An example of constructing an FPAA is shown in FIGS. 8A–E for a matrix product tracking circuit. A circuit representing a class of circuits of interest is selected and its schematic diagram obtained. FIG. 8A shows the result of these steps. Next, a circuit labeled multi-graph for the matrix product tracking circuit is derived, as shown in FIG. 8B. The multi-graph is then generalized to a superset, as shown in FIG. 8C. Global signal interconnections are selected because if the matrices are scaled up, the number of connections to the summing nodes grows. If the output matrix has more than one element as a result of scaling up, the same input signals must be distributed to more than one product element, which also leads to global signal interconnections. The contents of the individual cells are then determined, as shown in FIG. 8D. Since current-mode summation can be done directly on a signal line, there is no need to realize Σ nodes as part of cells. A single cell will contain the multiplication operation. The cell is realized as a current-mode one. Connections between the cells are made according to the graph of FIG. 8C, as shown in FIG. 8E. Various programmable devices, created by the method described herein for different classes of circuits, such as filters and matrix multiplication circuits, can be merged after creation to provide a programmable device capable of accommodating circuits of both classes. Such merge operations will typically lead to the extension of functionality of individual cells of the programmable device for the circuit of the first class by the operations necessary to realize the circuits of the second class, and the like extension of the interconnection scheme. For instance, functionality of the cell can be extended by whatever is required to implement circuits, such as filters. If filters are considered, integration and summation would be added to the functions performed by individual cells. FPAA can be customized for the various classes of circuits.

Method of Programming the FPAA

Figure 9:
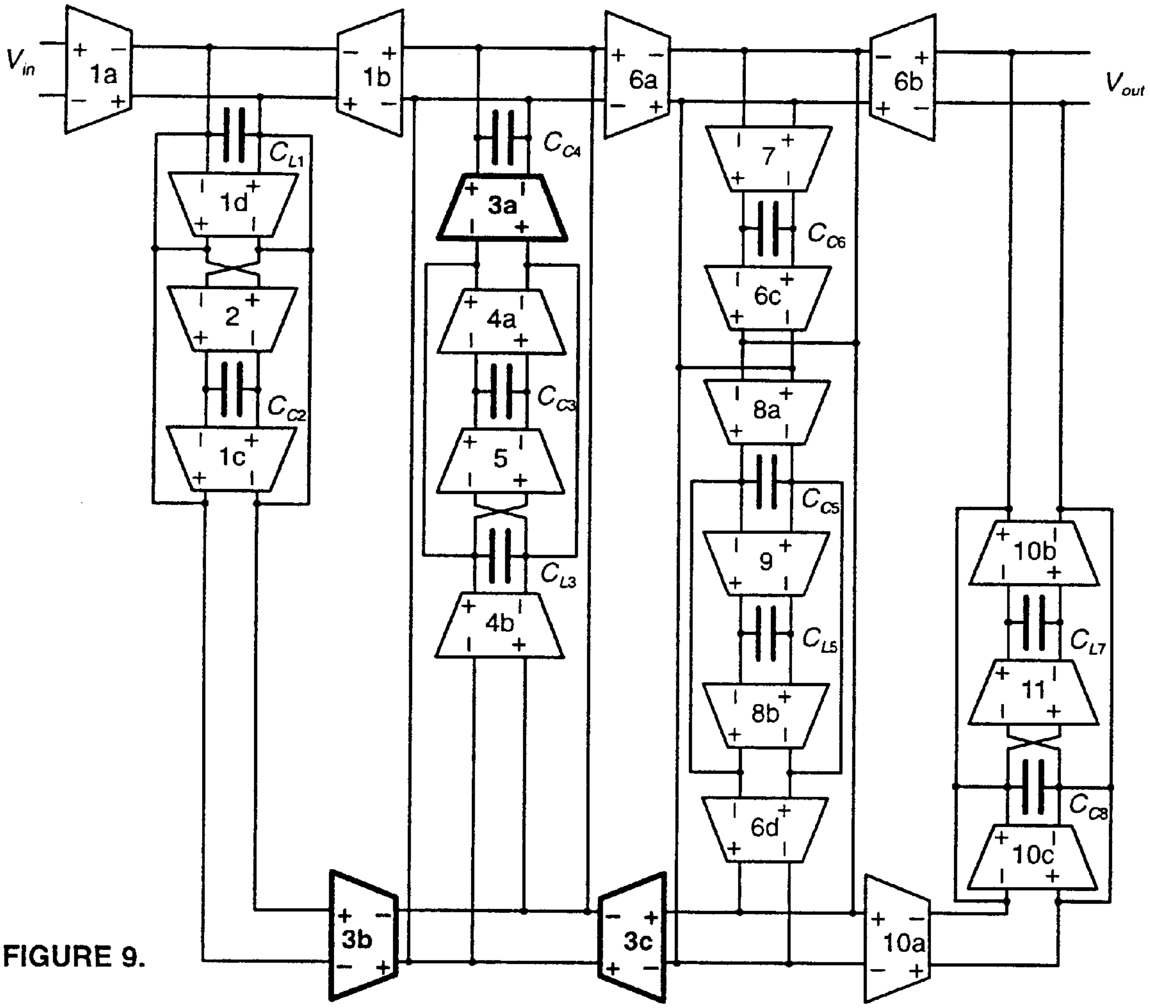
FIG. 9 illustrates an electrical schematic of an eight-order, elliptic band-pass filter realized as an OTA-C (operational transconductance amplifier and capacitor) ladder. This is a voltage-mode circuit, since each OTA takes a voltage signal as input, and although it produces a current signal, this current is always turned into voltage, either by the integrating operation of a capacitor. Each signal created in this circuit is going to be fed to some OTA (which can accept only voltage-mode signals as input) or connected to the output terminals of the circuit, which also require a voltage-mode signal. This circuit, and other voltage-mode circuits, can be realized in an equivalent current-mode form in the structure of the inventive device, if current-mode implementation of the device is preferred. The circuit preferably employs current sources $I_{switch}$ in the fashion shown in FIGS. 7B, C, which are not shown to avoid clutter.
Figure 10:
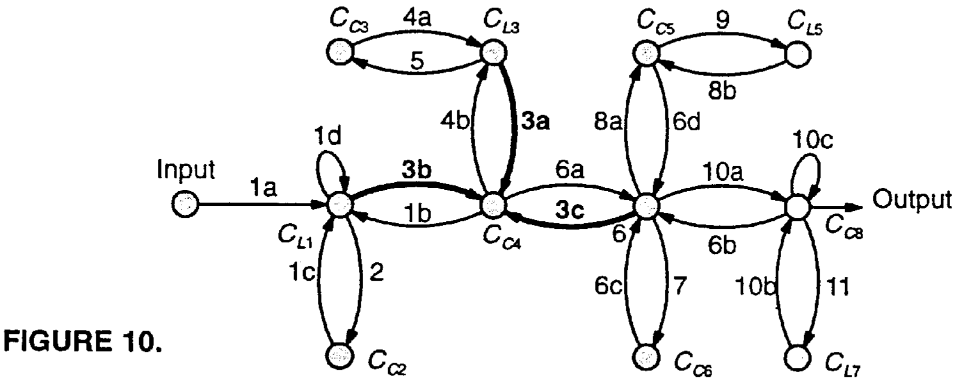
FIG. 10 shows a labeled multi-graph of the ladder filter of FIG. 9. It demonstrates that the filter has a topology comprising only local interconnections.

The present invention further provides a method for programming (i.e., mapping a particular circuit onto a programmable device such as an FPAA to form a programmed device) comprising: (1) obtaining a schematic diagram of the desired circuit (FIG. 9); (2) grouping circuit elements of the desired circuit into clusters that can be realized by single cells within the programmable device to form a schematic diagram with clustered elements (e.g., 3*a,b,c* in FIG. 9); (3) deriving a circuit labeled multi-graph from the schematic diagram with clustered elements (as shown in FIGS. 10, 11A—see Example 1 for details); and (4) embedding the circuit labeled multi-graph into an interconnection labeled multi-graph of the programmable device (shown in FIG. 1A) to form a programmed device (shown in FIG. 11B). In the example illustrating the above process, for instance, OTAs labeled 3*a,b,c* in FIG. 9 are grouped together and represented by edges 3*a,b,c* in the graph of FIG. 10, and the capacitor $C_{C4}$ connected to the OTAs is represented by a node of the graph labeled accordingly. Then the edges 3*a,b,c* and the node $C_{C4}$ are all mapped into a single node of the graph of FIG. 1A. Such a node represents a group of OTAs and a capacitor shown in FIG. 11A, and can be realized by a single cell of the programmable device. Eleven such cells can be mapped into the programmable device as in FIG. 11B.

The following examples are intended to illustrate possible applications of a programmable analog device according to the invention. They are not exclusive by any means. Those skilled in the art can readily find many other applications.

EXAMPLE 1

This example illustrates a continuous-time ladder filter constructed using the inventive FPAA and having only local signal interconnections. FIG. 9 shows an electrical schematic of an eight-order, elliptic band-pass filter realized as an OTA-C ladder. This is a voltage-mode circuit, since each OTA takes a voltage signal as input, and although it produces a current signal, this current is always turned into voltage, either by the integrating operation of a capacitor (possibly only parasitic input capacitor of (an)other OTA(s)), or by another OTA with a feedback connection, which is equivalent to a resistor. Each signal created in this circuit is going to be fed to some OTA (which can accept only voltage-mode signals as input) or connected to the output terminals of the circuit, which also require a voltage-mode signal. This circuit, and other voltage-mode circuits, can be realized in an equivalent current-mode form in the structure of the presented device, if current-mode implementation of the device is preferred.

At first, the network of the filter does not exhibit much regularity, nor locality of connections. The easiest way to see both is by drawing the graph of connections of the circuit. Each pair of wires carries one differential signal, represented by a single node of the graph (FIG. 10). Each OTA is represented as a directed edge of the graph (FIG. 10). The graph reveals regularity which leads to a realization based on regular, locally-only interconnected structure. One particular way of deriving a regular structure for the circuit is by grouping all edges coming into a given node as a single unit. As an example, consider edges 3*a–c* (FIG. 10), representing OTA's with the same labels (FIG. 9) (as it is easy to notice, OTA's with outputs connected to the same pair of wires are labeled with the same numbers). OTA's 3*a–c* can be collected together as in FIG. 11A, forming a cluster with four inputs and one output (as for the realization of the whole filter circuit, nodes 1 and 10 would additionally require a feedback connection in one of the OTA's to realize lossy integration, and all four OTAs are required only in cell 6). Eleven such clusters can be connected locally only to comprise the whole filter, as is shown in FIG. 11B, wherein dashed lines indicate unused parts of the structure.

Instead of voltage-mode cells (OTA and C) current-mode cells of the programmable device may be used. The structure of connections is independent of the mode of signals, therefore, the cells in the programmable device are arranged in the same way as shown in FIG. 11B. Each cell works in an integrating mode, except cell 6, which realized "infinite" (i.e. very high) gain. Cells 1 and 10 realize lossy integrators, all others—lossless. All the signal interconnections are local, within the structure provided by the exemplified device. Since the input and output terminals are on the sides of the rectangular collection of cells in FIG. 11B, no extra global connections are necessary for this circuit, which can simply be placed in a corner of an array.

Most ladder filters of practical importance can be mapped into the structure of the exemplified FPAA in a similar way. Second-order (biquad) filters can be mapped too. Since every transfer function can be realized as a cascade of biquads and one-pole blocks (they can be realized by single cells), which can be then put next to each other in the array, the device provides a way of realizing continuous-time filters (in cascade or ladder topology) by means of local signal interconnections only.

EXAMPLE 2

This example illustrates an analog rank filter, a nonlinear circuit that is realized with local signal interconnections only. An analog rank filter is described, for example, in Paul et al., "A Simple Analog Rank Filter" *ISCAS*, IEEE, pp. 121–24, 1992. FIG. 12A shows a block diagram of a single cell of the exemplified analog rank filter and FIG. 12B shows how it can be mapped into the structure of the presented device. Two cells of the device are necessary to implement one cell of the rank filter. The left cell in FIG. 12B implements the left-hand part of the rank filter cell, and the right cell the right-hand part. One of ordinary skill in the art can identify functions performed by each cell in FIG. 12B. A required number of such cells can be placed next to each other to realize a rank filter circuit.

EXAMPLE 3

Figure 13:
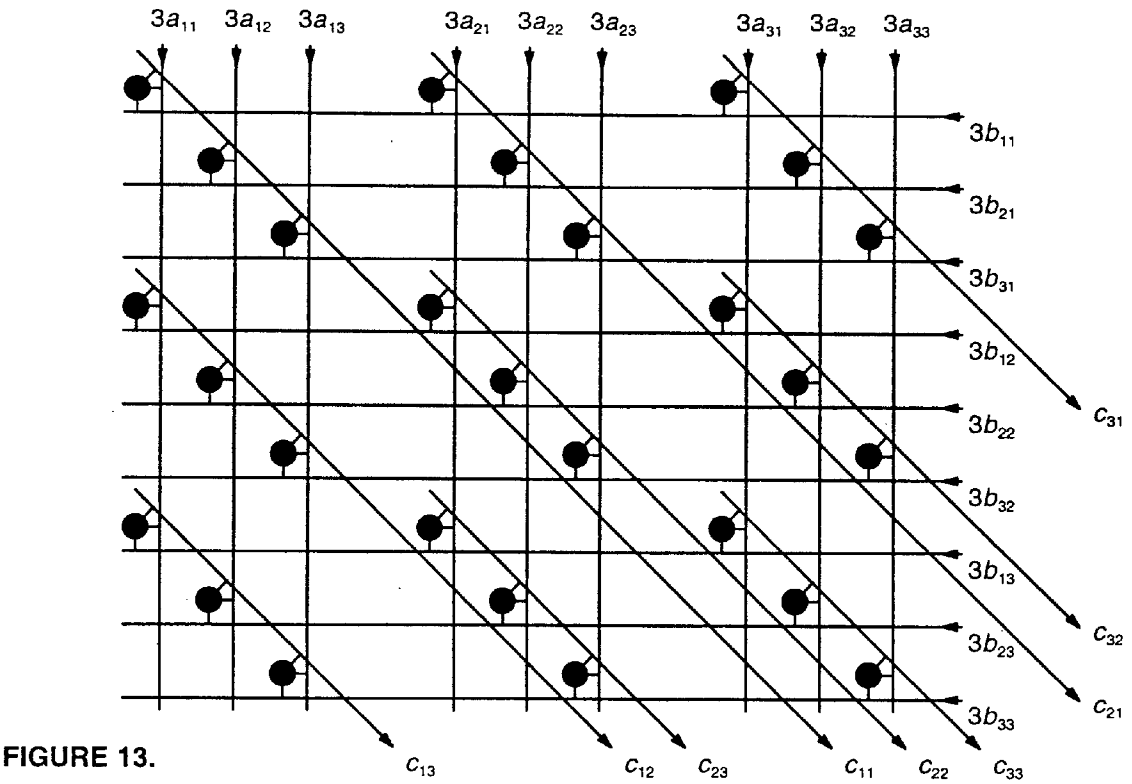
FIG. 13 shows the structure of a matrix product tracking circuit implemented in the structure of the inventive device realized in current-mode. It takes two time-varying matrices $A(t)=[a_{ij}]$ and $B(t)=[b_{ij}]$, both 3×3, and creates their product $C(t)=A(t)\cdot B(t)$ (a factor of 3 is required to account for the distribution of each input signal to 3 cells; alternatively the gain k (FIG. 2) of each cell could be increased by the same factor). The circuit can be generalized for any rectangular conformable matrices. Each element $c_{ij}(t)$ of the product matrix is produced by a "local" group of cells along a diagonal global signal line. However, to distribute the input signals and to collect the results signals, global connections are necessary. Each diagonal output line is used to sum elementary products $a_{ij}\cdot b_{jk}$, j=1, . . . , n, comprising the product element $c_{ik}$.

This example illustrates circuits also having global signal interconnections. FIG. 13 shows the structure of a matrix product tracking circuit. It takes two time-varying matrices $A(t)=[a_{ij}]$ and $B(t)=[b_{ij}]$, both 3 times 3, and creates their product $C(t)=A(t)\cdot B(t)$ (a factor of 3 is required to account for the distribution of each input signal to 3 cells; alternatively the input weights or gain k of each cell could be increased by the same factor). The circuit can be generalized for any rectangular conformable matrices. Each element $c_{ij}(t)$ of the product matrix is produced by a "local" group of cells along a diagonal global signal line. However, to distribute the input signals and to collect the results signals, global connections are necessary. Each diagonal output line is used to sum elementary products $a_{ij}\cdot b_{jk}$, $j=1, \ldots, n$, comprising the product element $c_{ik}$.

The "globality" of connections results primarily from the need to distribute input signals and collect output signals. Creation of each matrix product is done "locally" (although using global signal lines). Global signal lines are used in this example only at the "terminals" of the circuit, such as for the input and output signals. Global lines are not involved in transmitting internal signals of the circuit.

Figure 14:
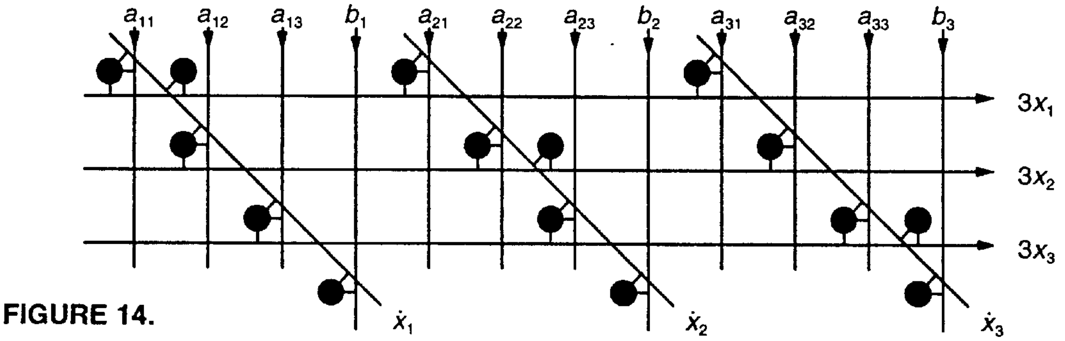
FIG. 14 illustrates a circuit solving a system of 3 algebraic equations with 3 unknowns $x_1(t), \ldots, x_3(t)$. The global connections in this circuit carry internal feedback signals, although the distance traveled by these signals is small.

If one modifies slightly the matrix product tracking circuit of FIG. 13, one can build a circuit tracking the solution of a system of linear equations. The solution x(t) of the system of algebraic equations $A(t)\cdot x(t)=b(t)$ can be found by solving a system $x(t)+A(t)\cdot x(t)-b(t)=0$ of differential equations provided that the matrix A(t) is always positive stable. In many practical cases, matrix A will be time-invariant, but it is instructive to see the solution of a more general problem, i.e., with a time-varying matrix A(t). FIG. 14 shows a circuit solving a system of 3 equations with 3 unknowns $x_1(t), \ldots, x_3(t)$. The global connections in this circuit carry internal feedback signals, although the distance traveled by these signals is small.

Figure 15:
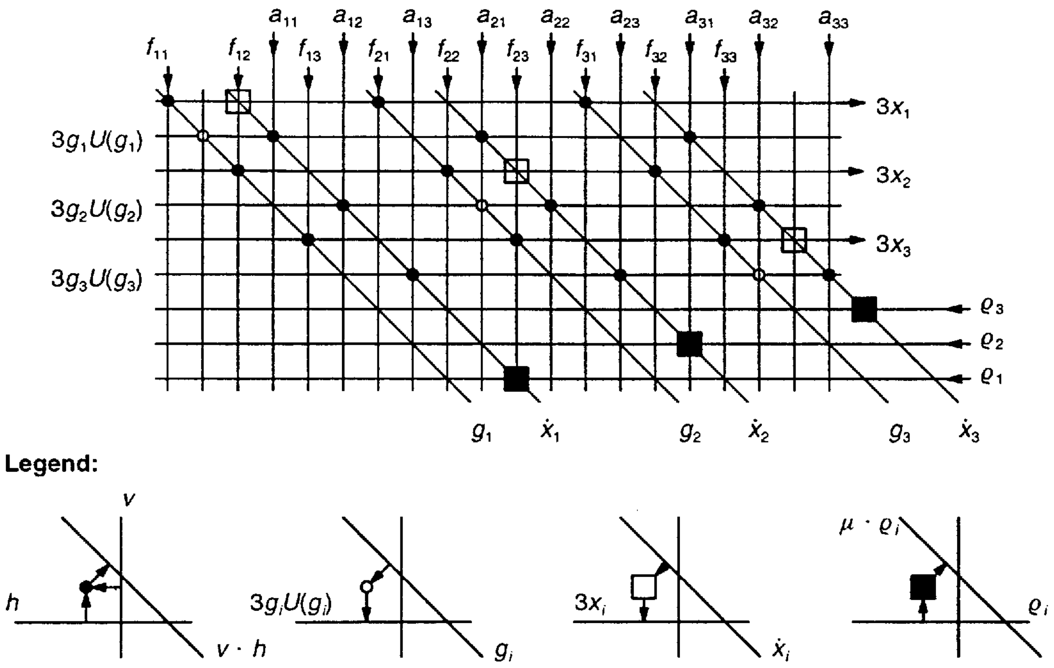
FIG. 15 is a continuous-time circuit for solving a linear programming problem: given a set of constraints $g(t)=F(t)\cdot x(t)=[g_1(t), \ldots, g_m(t)]' \leqq 0$ (the inequality is supposed to hold for every element of the vector; F is a rectangular matrix of constraints coefficients, g is a vector representing individual constraints), minimize the objective function $\epsilon(x_1, \ldots, x_n)=\epsilon\cdot x=\epsilon_1 x_1+\ldots+\epsilon_n x_n$, where $\epsilon=[\epsilon_1, \ldots, \epsilon_n]$. Application of the method of steepest descent leads to a system of equations $x=-\mu\cdot\epsilon'-2a\cdot A\cdot\mathrm{diag}(g)\cdot U(g)$, where U(g) denotes the step function, diag(g) denotes a diagonal matrix with elements of vector g on the main diagonal, and $\mu$ and a are constants ($\mu\to 0$, $a\to\infty$). This system can be solved by the circuit shown in FIG. 18.

A linear programming problem can be stated: given a set of constraints $g(t)=F(t)\cdot x(t)=[g_1(t), \ldots, g_m(t)]' \leqq 0$ (the inequality is supposed to hold for every element of the vector; F is a rectangular matrix of constraints coefficients, g is a vector representing individual constraints), minimize the objective function $\epsilon(x_1, \ldots, x_n)=\epsilon\cdot x=\epsilon_1 x_1+\ldots+\epsilon_n x_n$, where $\epsilon=[\epsilon_1, \ldots, \epsilon_n]$. Application of the method of steepest descent leads to a system of equations $x=-\mu\cdot\epsilon'-2a\cdot A\cdot diag(g)\cdot U(g)$, where U(g) denotes the step function, diag(g) denotes a diagonal matrix with elements of vector g on the main diagonal, and $\mu$ and a are constants ($\mu\to 0$, $a\to\infty$). This system can be solved by the circuit shown in FIG. 15. In the case of linear constraints matrix A will be identical to matrix F, nevertheless a more general circuit not assuming this equality is shown as an illustration of the versatility of the inventive device. A simplified circuit, with only matrix F input, can be easily derived.

EXAMPLE 4

Figure 16:
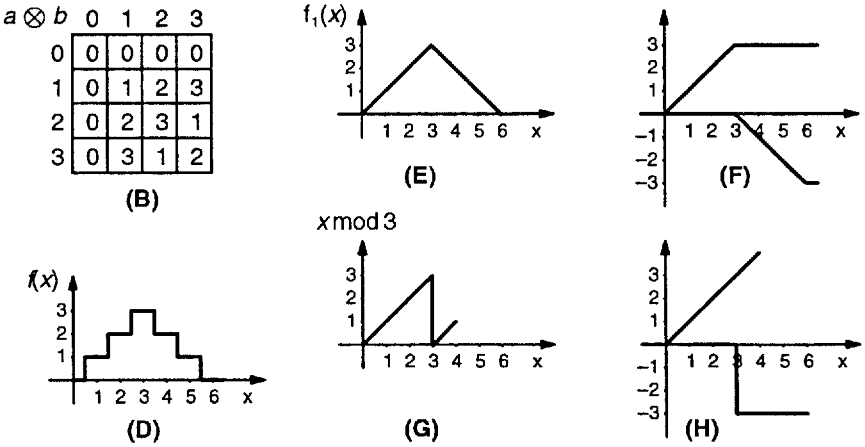
FIGS. 16A and B show the tables for addition and multiplication in Galois field of four elements ($GF(2^2)$), respectively. Each of these operations can be realized by the FPAA cells; only two of the cell's inputs are used at a time. Addition can be realized as $a \oplus b=f(a+b)$ for $a\neq b$ (FIGS. 16C and D), and $a \oplus b=0$ otherwise. The condition a=b can be detected by the control block of a cell. Instead of function $f(x)$ (FIG. 16D) a smooth function $f_1(x)$ (FIG. 16E) can be used. This function can be realized by adding two characteristics of the clipping blocks shown in FIG. 16F. If the function of the form shown in FIG. 16D is required, it can be realized by providing more clipping blocks in the cell. Multiplication $a \otimes b$ in ($GF(2^2)$) (FIG. 16B) can be realized as $a \otimes b=((a+b-2) \bmod 3)+1$ for $a\neq 0$ and $b\neq 0$, and $a \otimes b=0$ otherwise. Mod 3 operation can be realized, as shown in FIGS. 16G, by adding two characteristics of the clipping blocks shown in FIG. 16H.

This example illustrates Galois field $GF(2^2)$ operations as part of MVL applications. FIGS. 16A and B shows the tables for addition and multiplication in Galois field $2^2$. Each of these operations can be realized by the cells of FPAA, assuming that only two of the cell's inputs are used at a time. Addition can be realized as a $\oplus$ b=$f$(a+b) for a≠b (FIGS. 16C and D), and a $\oplus$ b=0 otherwise. The condition a=b can be detected by the control block of a cell. This requires programming the weights of one of the input multiplexers/summers to calculate the difference a−b of the input signals, selecting constant 0 for comparison in the control block, and controlling the weights of the other input multiplexer to set them to zero if a=b was detected. Instead of function $f(x)$ (FIG. 16D) a smooth function $f_1(x)$ (FIG. 16E) can be used. This function can be realized by adding two characteristics of the clipping blocks shown in FIG. 16F. If the function of the form shown in FIG. 16D is required, it can be realized by providing more clipping blocks of the cell.

Multiplication a $\otimes$ b in the field (FIG. 16B) can be realized as a $\otimes$ b=((a+b−2) mod 3)+1 for a≠0 and b≠0, and a $\otimes$ b=0 otherwise. The two conditions for a and b can be tested independently by the comparators in the control block, and upon at least one of them being true the input weights of the multiplexer/summer would be turned down to 0. Mod 3 operation can be realized, as shown in FIGS. 16G and H. The control block performs the necessary logic operations. The realizations of GF($2^2$) operations proposed in this example are similar to the ones presented in Zilic et al., "Current-mode CMOS Galois Field Circuits" *ISMVL* '93, p. 245–250.

EXAMPLE 5

This example illustrates an application of the addition and multiplication functions in GF($2^2$) described in example 4 above to combinational functions synthesis method based on orthogonal expansions. FIG. 17A shows a block diagram of a structure realizing a function of input variables $X_1$, $X_2$, . . . , $X_m$. Each column realizes one base function over GF($2^2$). Multiplied by a constant from GF($2^2$), this function is added to the other base functions. All operations are in GF($2^2$). FIG. 17B shows an example of realization of one of the functions $f_i$. Since each cell can realize the identity operation (see Table 2), it is possible to omit certain input variables $X_i$, $X_3$ in this example. More than one column of cells can be used for the realization of each $f_i$ if necessary. Also, it may be convenient to make certain input variables available on more than one horizontal global line. An alternative approach, based upon providing literals on horizontal lines, or some functions of single variables which are convenient for the creation of literals, is also possible. In one such approach the powers (i.e., multiple products in GF($2^2$)) are used to create polynomial expansions of MVL functions.

Figure 17:
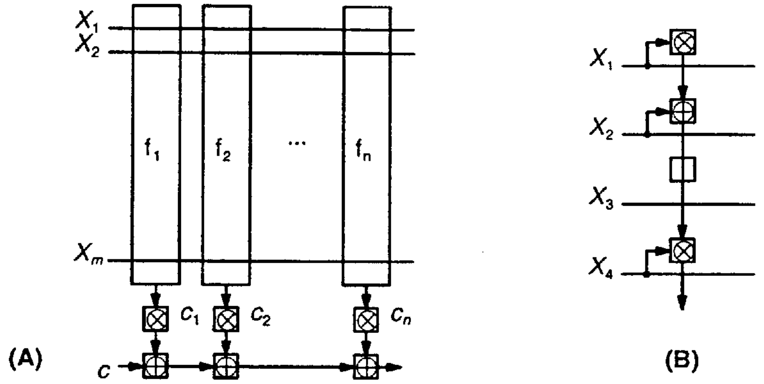
FIG. 17A shows a block diagram of a structure realizing an orthogonal expansion of a 4-valued function of input variables $X_1, X_2, \ldots, X_m$, over $GF(2^2)$. Each column realizes one orthogonal function over $GF(2^2)$. Multiplied by a constant from $GF(2^2)$, this function is added to the other orthogonal functions. All operations are in $GF(2^2)$.
FIG. 17B shows an example of realization of one of the functions $f_i$.

The same structure illustrated in FIG. 17 is used for the implementation of Post logic. Each cell realizes min and max operations (See Table 1) instead of $\otimes$ and $\oplus$, respectively, and literals of the form shown in FIG. 3D. Each function $f_i$ is realized as in FIG. 17B, except that the cells realize min, max, or identity operation.

The structure of FIG. 17A can be used for realization of combinational functions with other methods. In such realizations, unlike the ones based upon orthogonal expansions, due to the availability of addition, multiplication (in the conventional sense), and nonlinear operations on signals, some combinational functions have very efficient implementations.

Figure 18:
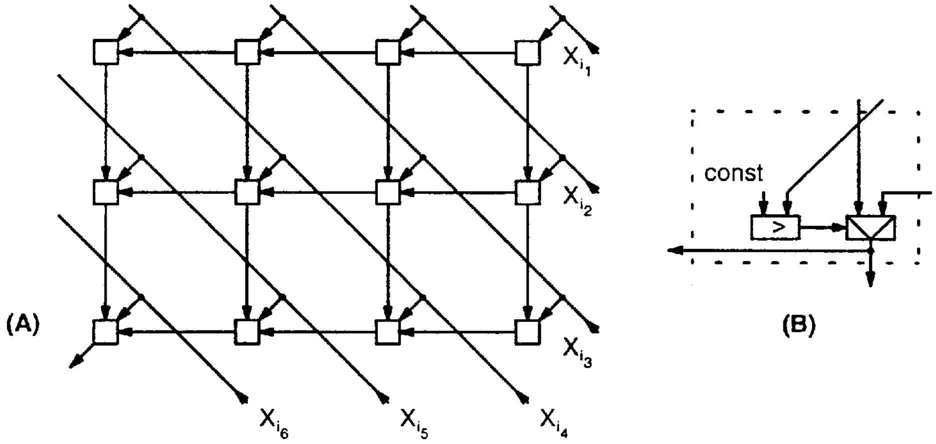
FIG. 18A shows a structure for implementations based upon generalized Shannon expansion of MVL functions. Some input variables need to be connected to more than one diagonal line. More general forms of the same kind are possible, based upon other operators than > used for separation, for instance even vs. odd parity, based on matrix orthogonality, which is a generalization of an approach for two-valued functions.
FIG. 18B shows functions performed by each cell.

The topology of MVL circuits mapped into the inventive FPAA does not have to be constrained, such as the one shown in FIG. 17. Global vertical and diagonal signal lines can be used, if necessary, to achieve greater flexibility of the circuits' topology. FIG. 18 shows a structure for implementations based upon generalized Shannon expansion of MVL functions. Some input variables need to be connected to more than one diagonal line. More general forms of the same kind are possible, based upon other operators than > used for separation, for instance even vs. odd parity, based on matrix orthogonality, which is a generalization of an approach known for two-valued functions.

The integrator block is used as a memory element, enabling realization of sequential circuits. Since each cell is capable of realizing identity function, and global connections are available, larger, irregular structures, composed of combinational and sequential parts, can be built with the inventive FPAA.

EXAMPLE 6

Figure 19:
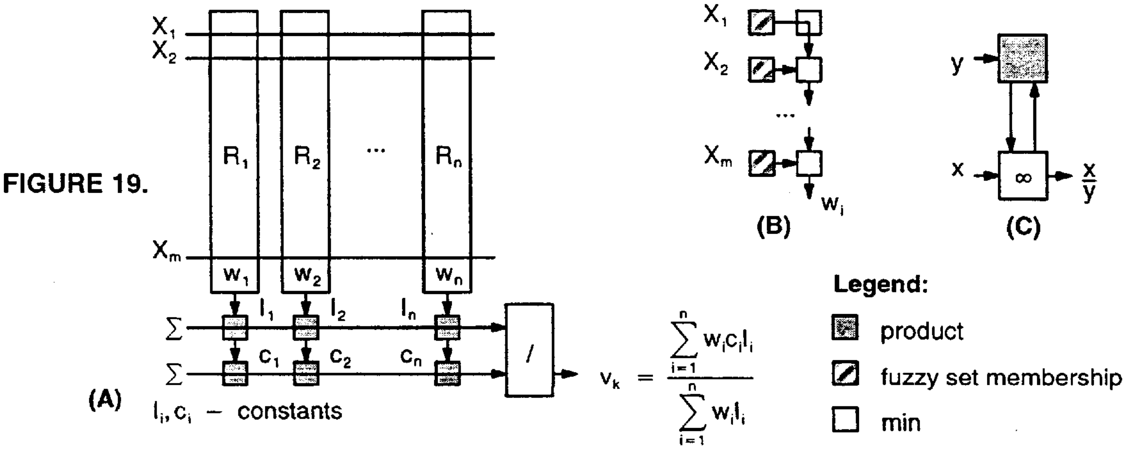
FIG. 19 shows an example of a fuzzy controller.

This example illustrates an application of the inventive FPAA for fuzzy logic and continuous logic (such as Lukasiewicz logic) circuits, for example a fuzzy logic controller with correlation-product inference. A structure similar to the one shown is FIG. 17A is shown in FIG. 19A and used to implement a controller with m input variables and n fuzzy inference rules. FIG. 19B shows details of each rule implementation. Fuzzy membership function is implemented as a trapezoidal DC transfer function of the kind shown in FIG. 3C. Activation values $w_i$ are multiplied by centroid values of the fuzzy rules consequents $c_i$, and their areas $I_i$, yielding two sums computed on two horizontal global lines. The final expression for the defuzzified output variable $v_k$ is produced by a two-quadrant divider shown in FIG. 19C.

Based on these these designs, other continuous-time matrix manipulation circuits, such as matrix addition, or inversion, and other circuits can be created according to the prior art knowledge in analog computers design. The methodology of realization of various circuits implemented in the programmable circuit device structure can be also a basis of more general circuit synthesis. For instance, if one designs a continuous-time filter (like the band-pass filter described above) in the structure of the device, the mapping of the filter components into the structure of the programmable device, together with the FPAA's floor plan, can be used as a basis for a standard custom design of such a filter, leading to the improved layout of the filter due to the use of local connections only. Other applications of the invention include but are not limited to classical neural networks; cellular neural networks; immunocomputers; Wiener and Kalman filters; state-space and other adaptive filters; differential and integral equation solvers; partial differential equation (PDE) solvers (by finite element method); combinatorial optimization solvers; consistent labeling problem solvers; Ricatti control circuits; reverse tracking robot and other robot control problems; cellular automata; gas Ising problems; and optimal control problems (e.g., Kurman chains).

Having illustrated and described the principles of the invention in a preferred embodiment, it should be apparent to those skilled in the art that the invention can be modified in arrangement and detail without departing from such principles. For example, discrete or integrated components of various types may be employed for the various parts of the programmable device, as is known to those of skill in the art. Technologies such as bipolar, MOS, NMOS, PMOS, ECL, and others may be used as desired.

EXAMPLE 7

This example illustrates a FPAA structure (ladder filter) with local interconnections (FIG. 11B). Each cell derives a weighted sum of selected signals from four nearest neighbors and optionally performs lossy or lossless integration to produce its own output signal (FIG. 11C). An eighth-order elliptic band-pass ladder filter has been mapped into the FPAA. Dashed lines show unused elements and connections. All cells in the structure are identical, however, in the filter they realize three different functions: ideal integration, lossy integration and amplification, with parameters varying from cell to cell. The illustrated design does not use any switches in the signal path. A straightforward implementation of amplification/integration in OTA-C (operational transconductance amplifier and capacitor) technique (Schaumann et al. infra. and Tan, infra.) leads to a capacitor connected to the OTA's output via electronic switches, degrading the frequency response.

A test circuit, containing an amplifier/integrator core of a cell (FIGS. 24 and 25A, B), was fabricated in a Maxim CPI transistor-array process. To avoid clutter, auxiliary bias and common-mode feedback circuitry was omitted in the figures. The input buffer $k_1$ (FIGS. 6A, B), comprising transistors $Q_{11}$–$Q_{16}$ (FIG. 23) was based on a Gilbert current-mode amplifier. When $I_{E11}$, $I_{E12}$ are off, no signal is passed to the cell (an inactive connection in FIG. 11B). When one of the sources is on, the signal is transmitted with optional gain (dependent of the bias) of up to about 10. The buffer also eliminates common-mode signals and separates high impedance $g_m$ input from other cells.

In the integrating mode (FIGS. 6A, 23) sources $I_{E12}$, $I_{C15}$ and $I_{C16}$ are off. Outputs of the buffer are connected to a simplified $g_m$cell (Darlington pairs $Q_{25}$–$Q_{26}$, $Q_{27}$–$Q_{28}$) and to the capacitors C. A two-stage current amplifier $k_2$ ($Q_{21}$–$Q_{24}$, $Q_{31}$–$Q_{32}$, $Q_{35}$–$Q_{36}$) follows $g_m$. $Q_{35}$, $Q_{36}$ with active loads and emitter follower $Q_{37}$ $Q_{38}$ provide voltage output. With $I_{E31}$ off, differential output current is $I_{C33}$, $I_{C34}$ minus collector currents of $Q_{37}$, $Q_{38}$ With capacitors C, this is a classic Miller integrator in differential form with an additional current output. The gain can be changed by changing bias of the input buffer.

In amplifying mode (FIGS. 6B, 23), $I_{E11}$ is off, the $g_m$ cell receives no signal, and $I_{E33}$ is off. Buffer $k_1$ feeds current directly to the amplifier $k_2$ (from $Q_{15}$, $Q_{16}$) The gain of this cascade can be turned up to 60 dB by changing the bias. The output current is $I_{C33}$, $I_{C34}$ minus collector currents of $Q_{33}$, $Q_{34}$.

Figure 24:
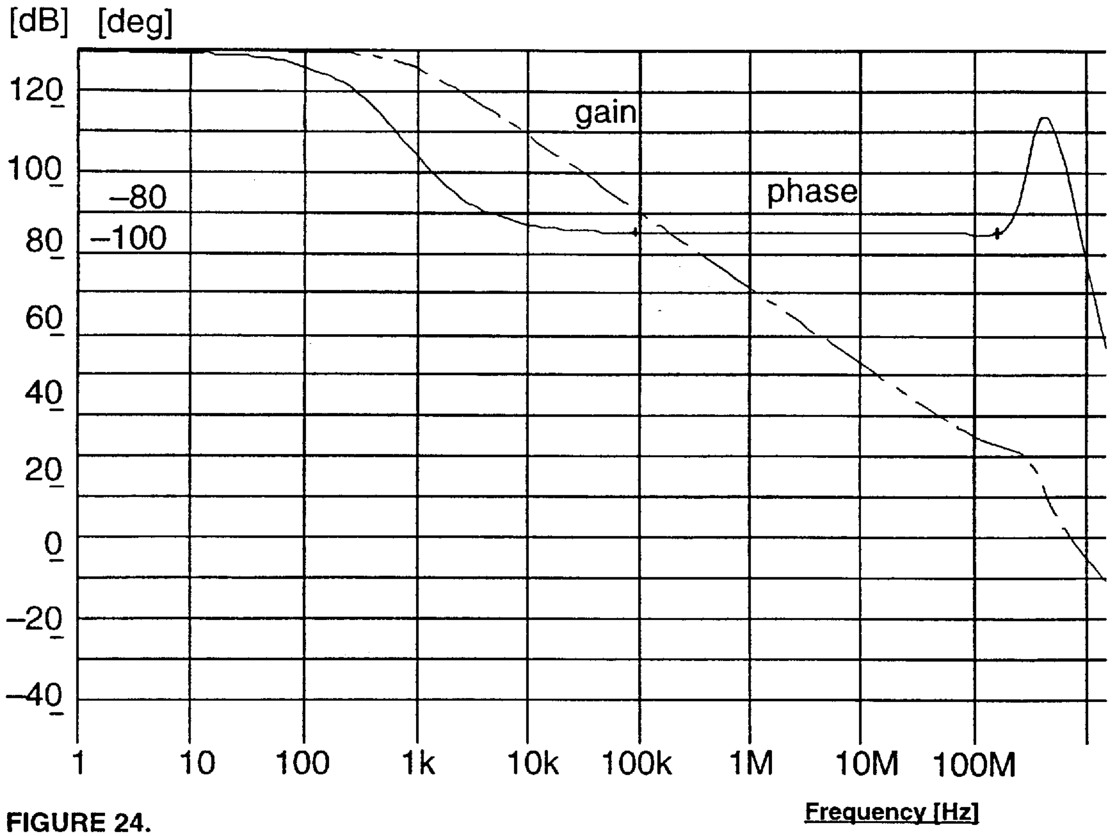
FIG. 24 shows the frequency response of the circuit of FIG. 23 in integrating mode and FIG. 25 shows its frequency response in amplifying mode. It is important that programming of the function of the circuit is attained without any switches in the signal path.
Figure 25:
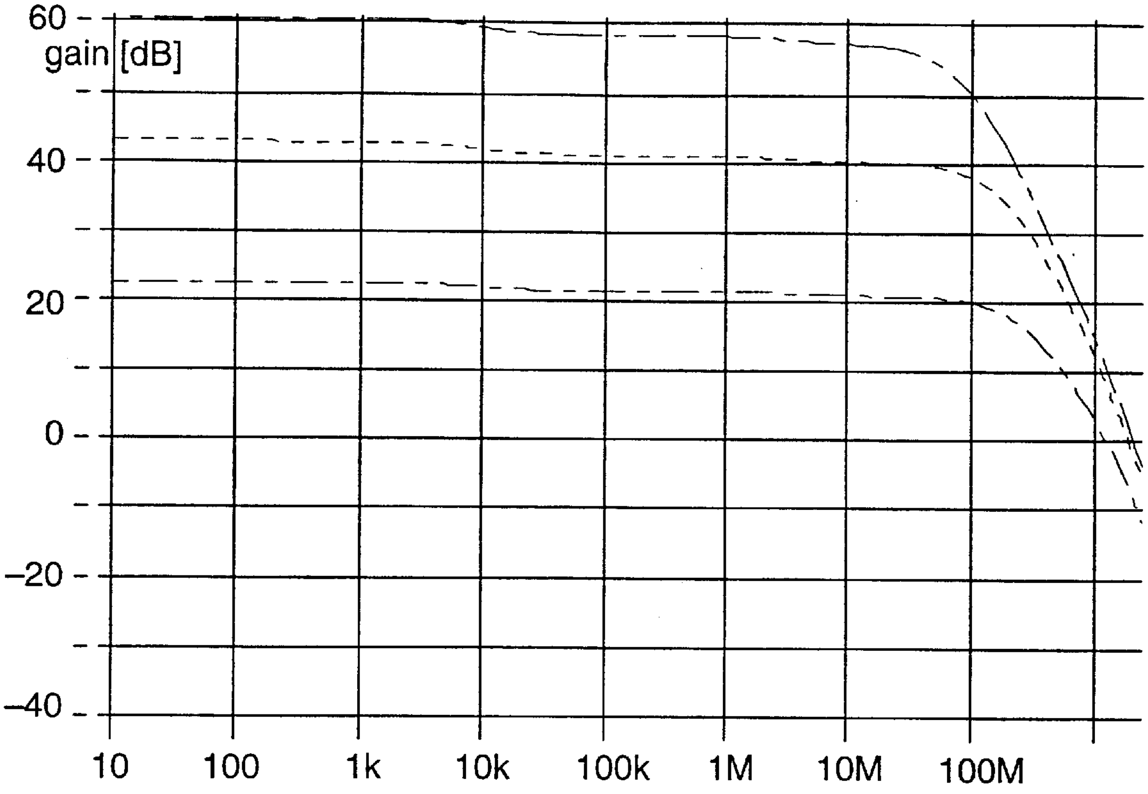

FIGS. 24 and 25 demonstrate frequency response in integrating and amplifying modes, respectively. Adjustment of $I_{E33}$ allows fine tuning of a phase response in the vicinity of −90°. Two common-mode feedback circuits (similar to the ones shown in FIG. 20B), assure proper voltage levels at the input of the $g_m$cell, and the collectors of $Q_{35}$ and $Q_{36}$. Voltage emitters of $Q_{21}$ and $Q_{22}$, proportional to the common-mode voltage at the $g_m$ input, is compared to a reference level. Correction signals are sent to the bias sources $I_{E11}$, $I_{C13}$, $I_{C14}$. A similar scheme is used for $Q_{35}$ and $Q_{36}$.

Changing voltage gain within the integrator results in shifting the useful range of frequencies along a frequency axis. Table 3 below summarizes main parameters of a single cell of this illustrative circuit.

TABLE 3

| | | |
|---|---|---|
| Power supplies | ±3 V | ±5 V |
| Power consumption | <12 mW | <20 mW |
| Technology | Tektronix/Maxim CPI transistor array with $f_T$ = 8 GHz | |
| Programming method | by changing bias, with no switches in the signal path | |
| Integrator (phase response) | | |
| with tuning | 90° ± 0.5° for 370 Hz–160 MHz | |
| without tuning | 90° ± 0.5° for 92 kHz–160 MHz | |
| DC gain | 130 dB | |
| Amplifier | | |
| Max gain | 60 dB | |
| Unity gain bandwidth | 855 MHz | |

The full cell should have five independently tuned input buffers: four to communicate with neighbors, and one to implement a one-pole function by feeding the integrator's output back to the input. Therefore, this example implements a fully programmable FPAA with exclusively local signal interconnections. The filter implementation in the FPAA does not suffer any more undesirable signal interactions than the ones unavoidably present in its non-programmable implementations. Ladders or other types of filters, as well as certain circuits modeling systems of differential equations can be mapped to this FPAA.

We claim:

1. A programmable analog device comprising an array of programmable analog signal processing cells, wherein each analog signal processing cell comprises an analog signal processing portion and a control circuit, wherein the control circuit controls the operation of the analog signal processing portion and may also take part in auxiliary information processing, wherein the array of programmable analog signal processing cells are locally interconnected by one or a plurality of signal interconnections to form the programmable analog device, wherein a cell is considered locally interconnected in that the number of cells connected to a given cell by programmable analog signal connections connected to the cell does not change as the number of cells in the programmable analog device varies, whereby a total length of unprogrammed signal connections has been minimized.

2. The programmable analog device of claim 1, further comprising one or a plurality of signal interconnections for connecting various cells of the array together, wherein said signal interconnections result in some cells becoming globally connected, wherein a cell is considered globally interconnected in that the number of cells connected to a given cell by programmable analog signal connections connected to the cell changes as the number of cells in the array varies, whereby a total length of unprogrammed signal connections has been minimized.

3. The programmable analog device of claim 2 wherein the control circuit comprises a means for exchanging information to and from the control circuit, a means for storing information, or a means for communicating with an associated analog processing portion of a cell.

4. The programmable analog device of claim 3 wherein the control circuit is programmed to determine the operation of the analog processing portion of the cell, and the analog processing portion of a cell comprises a means for performing one or more mathematical and other functions.

5. The programmable analog device of claim 4 wherein the analog processing portion is programmed by changing the operating point (bias) of electron devices in the signal path and not by using switches in the signal path.

6. The programmable analog device of claim 5 wherein the analog processing portion comprises an amplifier/integrator, wherein the amplifier/integrator comprises an operational transconductance amplifier (OTA) input stage, having an input signal and an output signal connected to a current amplifier, wherein the current amplifier comprises an additional voltage mode output, and a capacitor or a plurality of capacitors connected to the voltage mode output of the current amplifier and to the input of the OTA, wherein the current-mode output signal of the amplifier is proportional to its voltage-mode output signal, which represents the integral of the input current-mode signal, wherein the amplifier/integrator further optionally comprises an input current buffer having a current-mode input and two current-mode outputs, whereby one output is connected to the input of the OTA and the other output is connected to the input of the amplifier/integrator.

* * * * *